US012794480B2

(12) United States Patent
Kang et al.

(10) Patent No.: US 12,794,480 B2
(45) Date of Patent: Nov. 10, 2026

(54) PHASE-LOCKED LOOP CIRCUIT INCLUDING A PLURALITY OF CAPACITOR CELL ARRAYS WITH DIFFERENT CAPACITANCE CHANGES AND CONTROL METHOD THEREOF

(71) Applicant: Samsung Electronics Co., Ltd., Suwon-si (KR)

(72) Inventors: Pillseong Kang, Suwon-si (KR); Chulho Kim, Suwon-si (KR); Sangmin Yoo, Suwon-si (KR); Sangho Lee, Suwon-si (KR); Joonhee Lee, Suwon-si (KR); Ikkyun Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/884,601

(22) Filed: Sep. 13, 2024

(65) Prior Publication Data

US 2025/0132764 A1 Apr. 24, 2025

(30) Foreign Application Priority Data

Oct. 24, 2023 (KR) ........................ 10-2023-0142677
Jan. 16, 2024 (KR) ........................ 10-2024-0006761

(51) Int. Cl.
*H03L 7/099* (2006.01)
*H03B 5/12* (2006.01)

(52) U.S. Cl.
CPC ........... *H03L 7/099* (2013.01); *H03B 5/1212* (2013.01)

(58) Field of Classification Search
CPC ... H03L 7/099; H03L 2207/06; H03B 5/1212; H03B 5/1265

(Continued)

(56) References Cited

U.S. PATENT DOCUMENTS 7,403,147 B2 7/2008 Klaassen
7,696,830 B2 4/2010 Ohara et al.
(Continued)

FOREIGN PATENT DOCUMENTS

CN 101662260 A 3/2010
CN 102780453 A 11/2012
(Continued)

OTHER PUBLICATIONS

Search Report for European Patent Application No. 242077642, dated Mar. 20, 2025.

(Continued)

*Primary Examiner* — Richard Tan
(74) *Attorney, Agent, or Firm* — Fish & Richardson P.C.

(57) ABSTRACT

A phase-locked loop (PLL) circuit comprising an oscillator including a first and a second capacitor cell array, each including a plurality of capacitor cells, and a control logic circuit connected to the oscillator. The control logic circuit configured to generate control code configured to control the oscillator such that the oscillator is configured to output a signal with a target frequency, the control code generated based on a first frequency of a first signal output from the oscillator and the target frequency, control at least some of capacitor cells included in the first capacitor cell array based on a first partial code generated based on a specified number of bits of the control code, and control at least some of capacitor cells included in the second capacitor cell array based on a second partial code generated based on bits other than the specified number of bits of the control code.

18 Claims, 19 Drawing Sheets

(58) Field of Classification Search
USPC .............................................................. 331/8
See application file for complete search history.

(56) References Cited

U.S. PATENT DOCUMENTS

| | | | |
|---|---|---|---|
| 7,782,152 B2 | 8/2010 | Darabi et al. | |
| 8,907,708 B2 | 12/2014 | van Engelen et al. | |
| 9,356,555 B2 | 5/2016 | Loke et al. | |
| 9,503,017 B1 * | 11/2016 | Easter .................. | H03B 5/1265 |
| 2008/0122670 A1 | 5/2008 | Klaassen | |
| 2009/0002088 A1 | 1/2009 | Ohara et al. | |
| 2010/0039194 A1 | 2/2010 | Darabi et al. | |
| 2010/0052795 A1 | 3/2010 | Nakamura et al. | |
| 2012/0286888 A1 | 11/2012 | Hsieh et al. | |
| 2013/0093524 A1 | 4/2013 | Nakamura | |
| 2014/0084978 A1 | 3/2014 | van Engelen et al. | |
| 2016/0079919 A1 | 3/2016 | Loke et al. | |

FOREIGN PATENT DOCUMENTS

| | | | |
|---|---|---|---|
| CN | 106817127 | A | 6/2017 |
| CN | 113746453 | A | 12/2021 |
| KR | 10-2009-0016093 | A | 2/2009 |
| KR | 10-1434524 | B1 | 8/2014 |
| WO | 2010/0041159 | A1 | 4/2010 |

OTHER PUBLICATIONS

Kim Sungwoo et al, "A compact 22-Gb/s transmitter for optical links with all-digital phase-locked loop" IEEE, 2015.

Sang-Sun Yoo et al, "A 5.9 GHz LC-based digitally controlled oscillator with high frequency resolution using novel varactor pairs" IEEE, 2009.

* cited by examiner

PHASE-LOCKED LOOP CIRCUIT INCLUDING A PLURALITY OF CAPACITOR CELL ARRAYS WITH DIFFERENT CAPACITANCE CHANGES AND CONTROL METHOD THEREOF

CROSS-REFERENCE TO RELATED APPLICATIONS

This application claims priority under 35 U.S.C. § 119 to Korean Patent Application No. 10-2023-0142677 filed on Oct. 24, 2023 and No. 10-2024-0006761 filed on Jan. 16, 2024, in the Korean Intellectual Property Office, the entire contents of each of which are incorporated by reference herein in their entireties.

BACKGROUND

Example embodiments of the present inventive concepts described herein relate to phase-locked loop (PLL) circuits including a plurality of capacitor cell arrays with different capacitance variations and control methods thereof.

A PLL circuit is a control circuit that generates an output clock signal having a set phase (or frequency). The PLL circuit may generate a system clock used in various digital products. A digital phase-locked loop (DPLL) based on digital control may be used as an example of the PLL circuit.

The DPLL may include a digitally controlled oscillator (hereinafter referred to as "DCO"). The DPLL may control the phase (or frequency) of the output signal by controlling a plurality of capacitor cells included in the DCO.

This PLL circuit may control an electrical path, in which a clock signal is generated, by turning on or off at least some of the plurality of capacitor cells included in the oscillator.

In the meantime, the demand for DPLL that supports various frequency bands such as 3G, LTE, and 5G is increasing.

However, the PLL that supports multiple frequency bands may be required to include a plurality of capacitor cells having capacitance, which is smaller than or equal to specific capacitance, for fine frequency adjustment.

Here, as the number of capacitor cells increases, the size of a capacitor cell array included in the oscillator may increase.

SUMMARY

Example embodiments of the present inventive concepts provide a PLL circuit that outputs a signal having a specified frequency by using an oscillator with a minimum area.

According to some example embodiments, a phase-locked loop (PLL) circuit comprises an oscillator including a first capacitor cell array and a second capacitor cell array, each including a plurality of capacitor cells having different capacitances from each other, and a control logic circuit connected to the oscillator. The control logic circuit configured to generate a control code configured to control the oscillator such that the oscillator is configured to output a signal with a target frequency, the control code generated based on a first frequency of a first signal output from the oscillator and the target frequency, control at least some of capacitor cells included in the first capacitor cell array based on a first partial code generated based on a specified number of bits of the control code, and control at least some of capacitor cells included in the second capacitor cell array based on a second partial code generated based on bits other than the specified number of bits of the control code. The oscillator configured to output a second signal with a second frequency through an electrical path including capacitor cells configured to be turned on, from among a plurality of capacitor cells included in the oscillator.

According to some example embodiments, a control method of a phase-locked loop (PLL) circuit comprises generating a control code for controlling at least some of a plurality of capacitor cells included in an oscillator based on a first frequency of a first signal output from the oscillator and a target frequency; controlling at least some capacitor cells of a first capacitor cell array included in the oscillator based on a first partial code generated based on a specified number of bits of the control code; controlling at least some capacitor cells of a second capacitor cell array included in the oscillator based on a second partial code generated based on bits other than the specified number of bits of the control code; and outputting, by the oscillator, a second signal with a second frequency through an electrical path including capacitor cells, which are turned on, from among the plurality of capacitor cells. The first capacitor cell array and the second capacitor cell array including different numbers of capacitor cells with different capacitances from each other.

According to some example embodiments, a phase-locked loop (PLL) circuit comprises an oscillator including a first capacitor cell array and a second capacitor cell array, each including a plurality of capacitor cells having different capacitances from each other; and a control logic circuit configured to generate a control code based on a first frequency of a first signal output from the oscillator and a target frequency, the control code including thermometer code, the control code configured to control capacitor cells included in the oscillator. The control logic circuit configured to, when a noise of the first signal is less than a threshold value, turn on a same number of capacitor cells as a quotient, is the quotient obtained by dividing the control code by a first integer, from among capacitor cells included in the second capacitor cell array, and turn on a same number of capacitor cells as a remainder, the remainder obtained by dividing the control code by the first integer, from among capacitor cells included in the first capacitor cell array. The oscillator configured to output a second signal with a second frequency through an electrical path including capacitor cells configured to be turned on, from among the plurality of capacitor cells.

BRIEF DESCRIPTION OF THE DRAWINGS

The above and other objects and features of the present inventive concepts will become apparent by describing in detail some example embodiments thereof with reference to the accompanying drawings.

DETAILED DESCRIPTION

Hereinafter, some example embodiments of the present inventive concepts may be described in detail and clearly to such an extent that an ordinary one in the art may easily implement the present inventive concepts.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

Figure 1A:
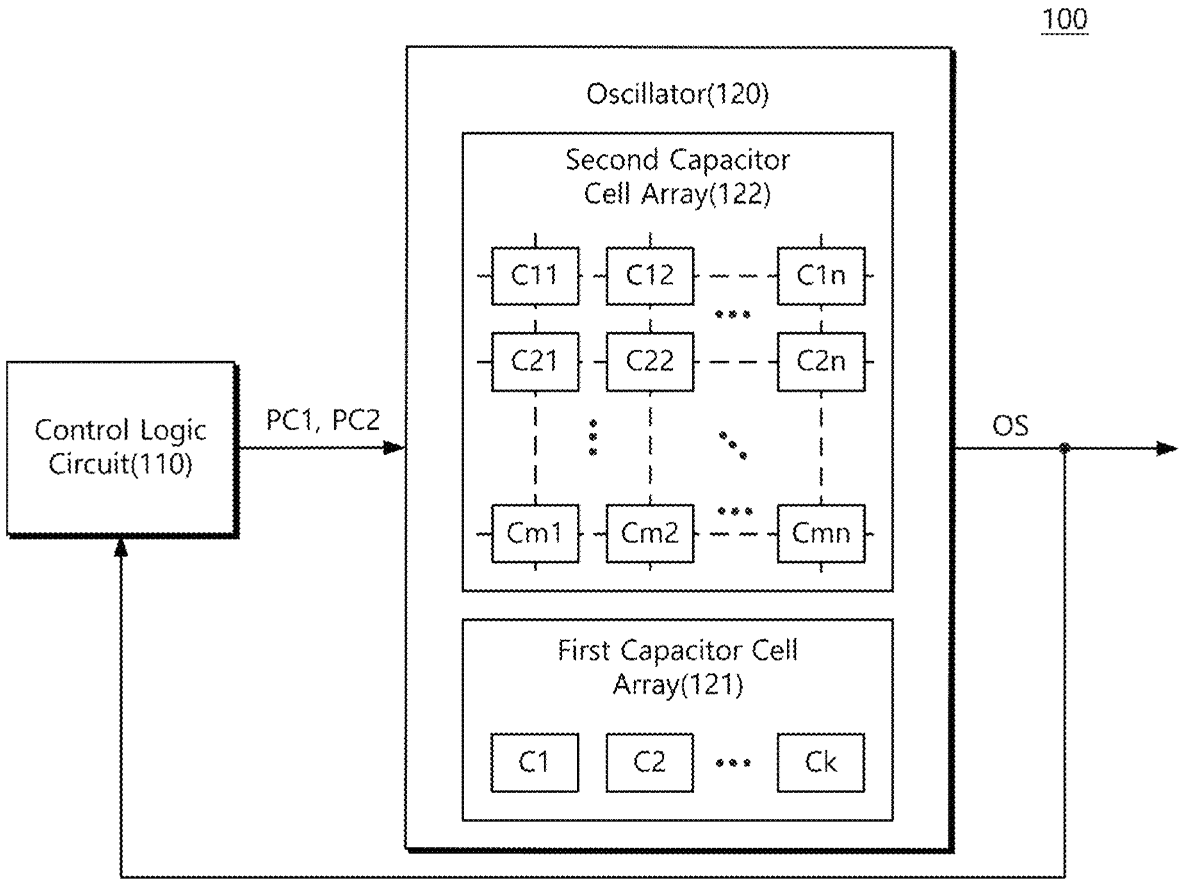
FIG. 1A is a block diagram showing a PLL circuit, according to some example embodiments.
Figure 1B:
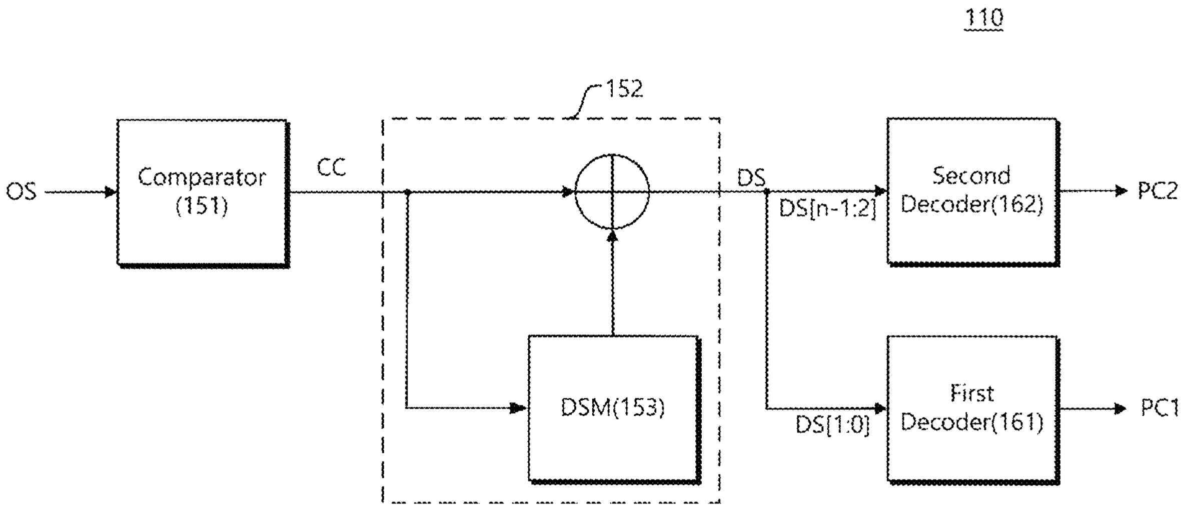
FIG. 1B is a circuit diagram showing a configuration of a control logic circuit, according to some example embodiments.

FIG. 1A is a block diagram showing a PLL circuit, according to some example embodiments. FIG. 1B is a circuit diagram showing a configuration of a control logic circuit, according to some example embodiments.

Referring to FIGS. 1A and 1B together, a PLL circuit 100 according to some example embodiments may include a control logic circuit 110 and an oscillator 120.

For example, the PLL circuit 100 according to some example embodiments may also be referred to as a "PLL device" or a "clock signal generation circuit".

Referring to FIG. 1A, the PLL circuit 100 according to some example embodiments may include the oscillator 120 that outputs an output signal OS in response to a first partial code PC1 and a second partial code PC2. Here, for example, the output signal OS may be understood as a clock signal with a specific, or alternatively desired frequency.

According to some example embodiments, the oscillator 120 may include a plurality of capacitor cells C11 to Cmn and C1 to Ck.

For example, the oscillator 120 may include a first capacitor cell array 121 consisting of the plurality of capacitor cells C1 to Ck arranged to correspond to a plurality of columns.

In some example embodiments, the oscillator 120 may include a second capacitor cell array 122 consisting of the plurality of capacitor cells C11 to Cmn arranged in the form of a matrix.

In some example embodiments, the capacitor cells C11 to Cmn included in the second capacitor cell array 122 may be arranged in an m×n array. For example, the capacitor cells C11 to Cmn included in the second capacitor cell array 122 may be arranged in the form of a matrix corresponding to 'm' rows and 'n' columns.

For example, the capacitor cells C11 to Cmn of the second capacitor cell array 122 may include 256 capacitor cells arranged in 8×32.

In some example embodiments, each of the capacitor cells C11 to Cmn and C1 to Ck of the first capacitor cell array 121 and the second capacitor cell array 122 may include at least one capacitor having the specified, or alternatively desired capacitance.

In some example embodiments, the capacitor cells C11 to Cmn and C1 to Ck of the first capacitor cell array 121 and the second capacitor cell array 122 may have the same area as each other.

Also, according to some example embodiments, the PLL circuit 100 may include the control logic circuit 110 connected to the oscillator 120.

For example, the PLL circuit 100 may include the control logic circuit 110 that receives the output signal OS output from the oscillator 120.

For example, the control logic circuit 110 may execute software (or a program) to control at least one other component (e.g., the oscillator 120) of the PLL circuit 100 and may process and calculate various types of data. The control logic circuit 110 may include a central processing device or microprocessor, and may control the overall operation of the PLL circuit 100. Accordingly, as described below, the operations performed by the PLL circuit 100 may be understood as being performed under the control of the control logic circuit 110.

According to some example embodiments, the control logic circuit 110 may include an algorithm for controlling the oscillator 120 (or the plurality of capacitor cells C11 to Cmn and C1 to Ck). For example, the algorithm may be a software code programmed inside the control logic circuit 110. In some example embodiments, the algorithm may be a hard code, which is hard-coded inside the control logic circuit 110, but example embodiments are not limited thereto.

The control logic circuit 110 may control at least some of the capacitor cells C11 to Cmn and C1 to Ck included in the first capacitor cell array 121 and the second capacitor cell array 122 depending on an algorithm.

For example, the control logic circuit 110 may turn on or off at least some of the capacitor cells C11 to Cmn and C1 to Ck included in the first capacitor cell array 121 and the second capacitor cell array 122.

According to some example embodiments, the control logic circuit 110 may turn on a transistor included in each of the capacitor cells C11 to Cmn and C1 to Ck included in the first capacitor cell array 121 and the second capacitor cell array 122.

According to some example embodiments, the control logic circuit 110 may turn off the transistor included in each of the capacitor cells C11 to Cmn and C1 to Ck included in the first capacitor cell array 121 and the second capacitor cell array 122.

Referring to FIG. 1B, the control logic circuit 110 according to some example embodiments may include a comparator 151, a dithering circuit 152, a first decoder 161, and a second decoder 162.

According to some example embodiments, the control logic circuit 110 may receive the output signal OS output from the oscillator 120 through the comparator 151.

In some example embodiments, the control logic circuit 110 may compare the frequency of the output signal OS output from the oscillator 120 with a target frequency by using the comparator 151. For example, the control logic circuit 110 may compare the first frequency of the first signal output from the oscillator 120 with the target frequency by using the comparator 151.

Here, for example, the target frequency may be stored in a storage space inside the PLL circuit 100.

In some example embodiments, the control logic circuit 110 may generate a control code CC based on the comparison result between the frequency of the output signal OS and the target frequency, For example, the control logic circuit 110 may generate the control code CC for controlling the oscillator 120 such that the oscillator 120 outputs a signal with the target frequency, based on the result of comparing the frequency of the output signal OS with the target frequency through the comparator 151, For example, when a difference between the frequency of the output signal OS and the target frequency exceeds a predetermined, or alternatively desired difference, the control logic circuit 110 may generate the control code CC for controlling at least some of the plurality of capacitor cells C11 to Cmn and C1 to Ck such that the oscillator 120 outputs a signal with the target frequency.

In some example embodiments, the control code CC may be understood as a thermometer code.

For example, it may be understood that the control code CC is a thermometer code corresponding to the number of capacitor cells, which are to be controlled by the control logic circuit 110 through the oscillator 120, or the multiple of unit capacitance.

For example, the control code CC may be the multiple of the unit capacitance, which are to be controlled by the control logic circuit 110 through the oscillator 120, and may be composed of a thermometer code between "1 and 1024".

For example, the control logic circuit 110 may control the capacitance of the oscillator 120 by the unit capacitance in response to the fact that the control code CC composed of the thermometer code is increased by "1".

In some example embodiments, the control logic circuit 110 may generate the first partial code PC1 and the second partial code PC2 by using at least some bits of the generated control code CC.

For example, the control logic circuit 110 may include the dithering circuit 152 that generates a dithering signal DS by dithering the control code CC.

According to some example embodiments, the dithering circuit 152 may include a delta sigma modulator (DSM) 153. For example, the dithering circuit 152 may include the DSM 153 that dithers a fractional bit of the control code CC.

The dithering circuit 152 may output the dithering signal DS by adding a signal, which is obtained or generated by dithering the fractional bit of the control code CC through the DSM 153, to an integer bit of the control code CC.

According to some example embodiments, the control logic circuit 110 may include the first decoder 161 that generates the first partial code PC1 by using the specified number of bits of the dithering signal DS (or the control code CC)

For example, the first decoder 161 may generate the first partial code PC1 by decoding the specified number of bits of the dithering signal DS.

For example, the first decoder 161 may generate the first partial code PC1 by decoding two bits DS[1:0] of the dithering signal DS. In other words, the first decoder 161 may generate the first partial code PC1 by decoding the two lower bits of the dithering signal DS.

In some example embodiments, the control logic circuit 110 may include the second decoder 162 that generates the second partial code PC2 by using bits other than the specified number of bits of the dithering signal DS.

For example, the second decoder 162 may generate the second partial code PC2 by decoding bits other than the specified number of bits of the dithering signal DS.

For example, the second decoder 162 may generate the second partial code PC2 by decoding bits DS[n−1:2] other than the two bits DS[1:0] of the dithering signal DS. In other words, the second decoder 162 may generate the second partial code PC2 by decoding bits other than the two lower bits of the dithering signal DS.

However, the number of bits and types of bits of the signal decoded by each decoder 161 or 162 are not limited to the example embodiments described above.

According to some example embodiments, the control logic circuit 110 may control at least some of the capacitor cells C11 to Cmn and C1 to Ck included in the oscillator 120 based on the first partial code PC1 and the second partial code PC2.

For example, the control logic circuit 110 may control at least some of the capacitor cells C1 to Ck included in the first capacitor cell array 121 based on the first partial code PC1.

In some example embodiments, the control logic circuit 110 may control at least some of the capacitor cells C11 to Cmn included in the second capacitor cell array 122 based on the second partial code PC2.

According to some example embodiments, as one capacitor cell among the capacitor cells C1 to Ck included in the first capacitor cell array 121 is controlled, the capacitance of the first capacitor cell array 121 may change by a first capacitance.

Here, for example, the first capacitance may be referenced as being the same as the unit capacitance controlled by the oscillator 120 as the control code CC composed of a thermometer code is changed by "1".

Accordingly, as the control code CC is changed by "1", the control logic circuit 110 may control the capacitance of the oscillator 120 by the unit capacitance by controlling one capacitor cell among the capacitor cells C1 to Ck included in the first capacitor cell array 121.

In some example embodiments, as one capacitor cell among the capacitor cells C11 to Cmn included in the second capacitor cell array 122 is controlled, the capacitance of the second capacitor cell array 122 may change by second capacitance.

Here, the second capacitance may be referenced as a value obtained by multiplying the first integer by the first capacitance. In other words, the second capacitor cell array 122 may have an integer multiple of the capacitance change of the first capacitor cell array 121.

For example, the second capacitance may be referenced as a value that is four times the first capacitance.

In other words, the control logic circuit 110 may control the capacitance of the oscillator 120 by four times the unit capacitance by controlling one of the capacitor cells C11 to Cmn included in the second capacitor cell array 122.

However, the magnitude relationship between the first capacitance and the second capacitance that changes as each capacitor cell is controlled in the first capacitor cell array 121 and the second capacitor cell array 122 is not limited to the above-described example embodiments.

According to some example embodiments, the control logic circuit 110 may control the first capacitor cell array 121 and the second capacitor cell array 122 based on the result of dividing the control code CC by the first integer.

The number of capacitor cells controlled by each of the first capacitor cell array 121 and the second capacitor cell array 122 according to the result, which is obtained as the control logic circuit 110 divides the control code CC by the first integer, may be referenced by Equation 1 below.

$$CC = I_1 \times a + b \quad \text{[Equation 1]}$$

Here, $I_1$ may be referenced as the first integer corresponding to the ratio of a capacitance change between the first capacitor cell array 121 and the second capacitor cell array 122. For example, 'a' may be referred to as a quotient obtained by dividing the control code CC by the first integer. According to some example embodiments, it may be understood that 'b' is a remainder obtained by dividing the control code CC by the first integer.

For example, among the capacitor cells C11 to Cmn of the second capacitor cell array 122, the control logic circuit 110 may control the same number of capacitor cells as the quotient 'a' obtained by dividing the control code CC by the first integer.

Among the capacitor cells C11 to Cmn of the second capacitor cell array 122, the control logic circuit 110 may control the same number of capacitor cells as the quotient 'a', which is obtained by dividing the control code CC by the first integer, based on the second partial code PC2.

For example, the control logic circuit 110 may turn on one capacitor cell among the capacitor cells C11 to Cmn of the second capacitor cell array 122 by the quotient of "1" obtained by dividing the control code CC of "6" by the first integer of "4".

In some example embodiments, among the capacitor cells C1 to Ck of the first capacitor cell array 121, the control logic circuit 110 may control the same number of capacitor cells as the remainder 'b' obtained by dividing the control code CC by the first integer.

Among the capacitor cells C1 to Ck of the first capacitor cell array 121, the control logic circuit 110 may control the same number of capacitor cells as the remainder 'b', which is obtained by dividing the control code CC by the first integer, based on the first partial code PC1.

For example, the control logic circuit 110 may turn on two capacitor cells among the capacitor cells C1 to Ck of the first capacitor cell array 121 by "2", which is the remainder obtained by dividing the control code CC of "6" by the first integer of "4".

In other words, the control logic circuit 110 may control the capacitance of the oscillator 120 by the capacitance corresponding to the control code CC by using the first capacitor cell array 121 and the second capacitor cell array 122, which have different capacitance changes from each other.

The oscillator 120 according to some example embodiments may output the output signal OS through an electrical path including turned-on capacitor cells.

For example, the oscillator 120 may output a second signal through an electrical path including capacitor cells other than the capacitor cells turned on by the control logic circuit 110.

Here, it may be understood that the second signal has a second frequency distinguished (e.g., different) from a first frequency of the first signal.

According to some example embodiments, the control logic circuit 110 may control the electrical path for generating the output signal OS in the oscillator 120. In some example embodiments, the control logic circuit 110 may control the frequency (or phase) of the output signal OS output from the oscillator 120.

Referring to the above-mentioned example embodiments, the control logic circuit 110 may generate the first partial code PC1 and the second partial code PC2 for controlling different capacitor cell arrays from each other based on the control code CC generated depending on the result of comparison between the frequency of the output signal OS and the target frequency.

In some example embodiments, the control logic circuit 110 may control at least some of the capacitor cells C11 to Cmn and C1 to Ck, which are included in the first capacitor cell array 121 and the second capacitor cell array 122, based on the first partial code PC1 and the second partial code PC2.

Here, for example, as one capacitor cell is controlled in each of the first capacitor cell array 121 and the second capacitor cell array 122, the capacitance of each of the first capacitor cell array 121 and the second capacitor cell array 122 may change by the different capacitances.

Accordingly, in some example embodiments, the control logic circuit 110 may control the capacitance of the oscillator 120 to the magnitude corresponding to the control code CC by using the first capacitor cell array 121 and the second capacitor cell array 122, which have different capacitance changes from each other.

Here, for example, the capacitor cells included in the first capacitor cell array 121 and the second capacitor cell array 122 may be formed to have the same area as each other.

In other words, compared to the case of including the number of capacitor cells corresponding to the control code CC, the oscillator 120 according to some example embodiments of the present inventive concepts may be composed of the relatively small number of capacitor cells.

In this way, the PLL circuit 100 according to some example embodiments of the present inventive concepts may minimize the area of the oscillator 120. Furthermore, in some example embodiments, the PLL circuit 100 may output a signal having a specified, or alternatively desired frequency by using the oscillator 120 with a minimum area. Accordingly, in some example embodiments, the PLL circuit 100 may be configured to quickly generate and output, to an electronic device, a signal having a specified, or alternatively desired frequency for supporting various frequency bands (e.g., 3G, LTE, and 5G), and may be configured to provide and/or enable fine frequency adjustment across the various different frequency bands based on the output of the oscillator 120, where the PLL circuit 100 controls the capacitance of the oscillator 120 to a magnitude corresponding to the control code CC by using the first capacitor cell array 121 and the second capacitor cell array 122, which have different capacitance changes from one another. For example, in at least some example embodiments, the PLL circuit 100 may be applied to a wireless system, a computer system, a semiconductor manufacturing system, a method of making a semiconductor device, a smartphone performing wireless transmission/reception, a tablet device, a smart TV, an Internet of things (IoT) device, a self-driving vehicle performing transmission/reception of signals and data of various frequency bands with storage devices and/or data processing servers, various kinds of Radio Frequency (RF) devices, and/or may be mounted on, or included in, one of various kinds of electronic devices.

Figure 2:
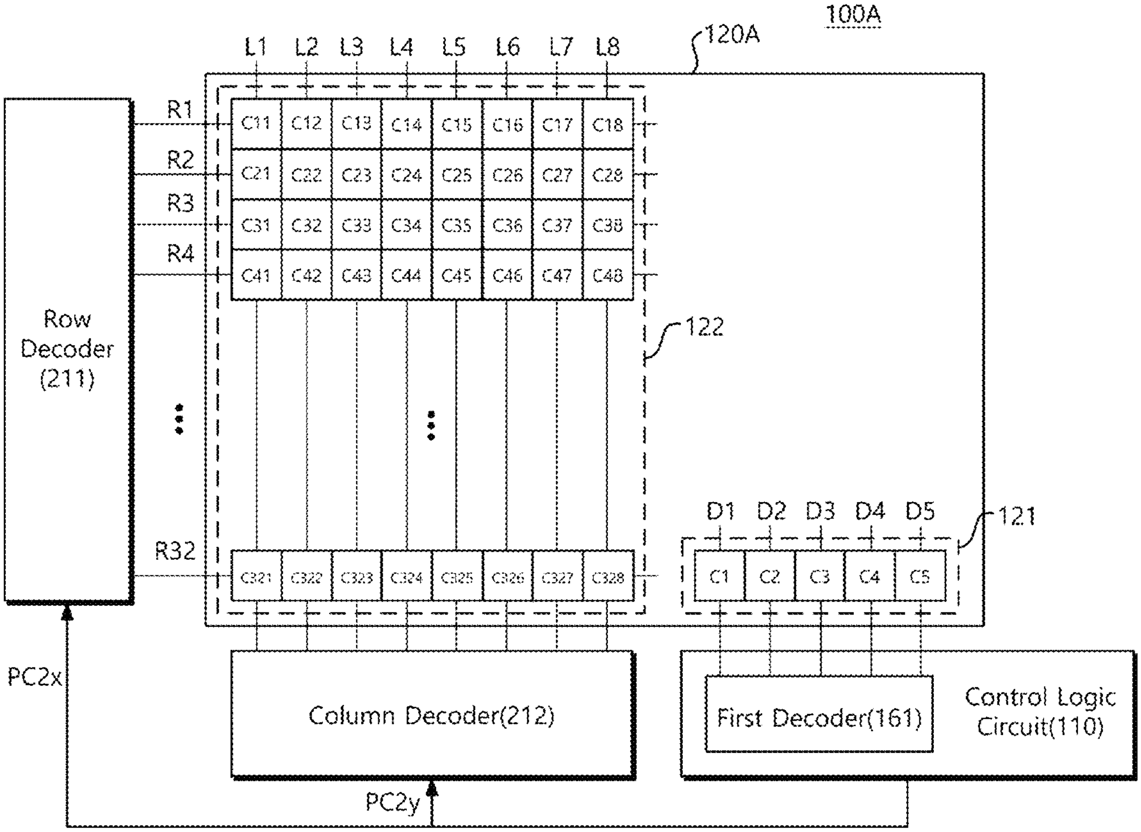
FIG. 2 shows a PLL circuit including a first capacitor cell array and a second capacitor cell array, according to some example embodiments.
Figure 3A:
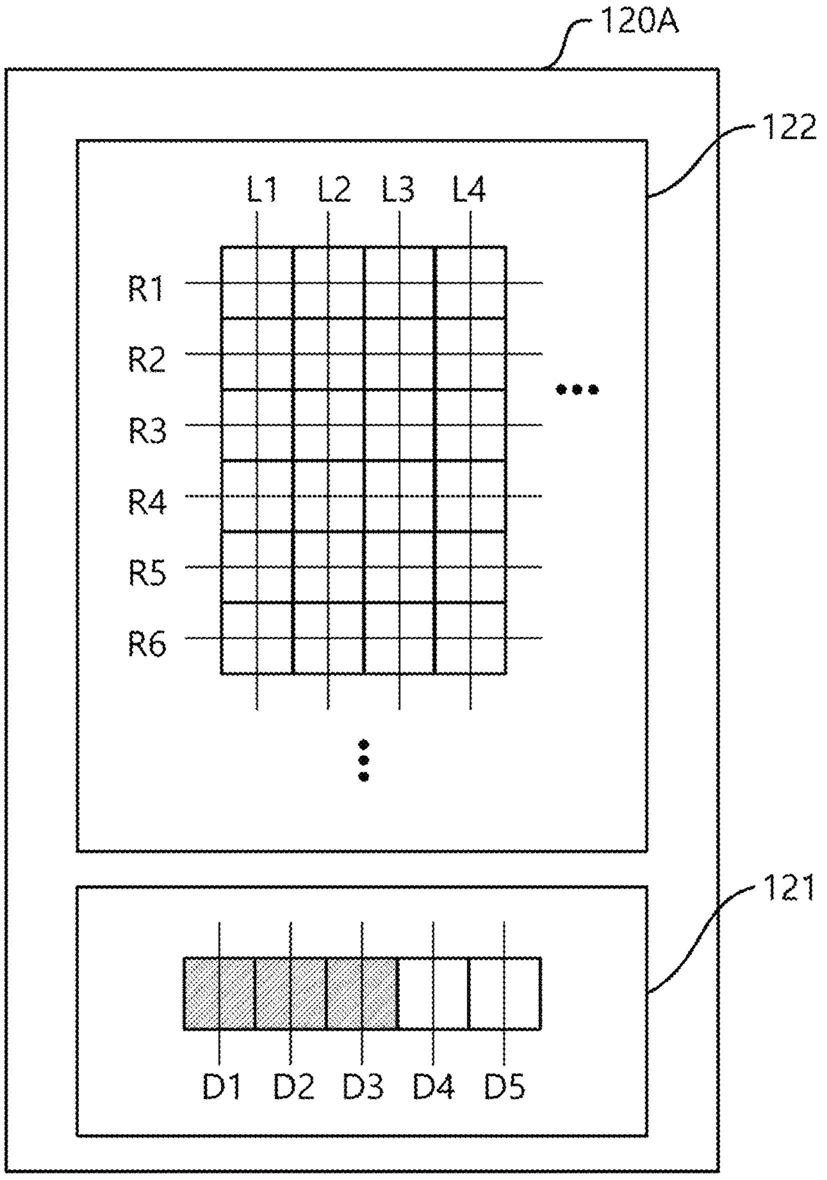
FIG. 3A shows a configuration for controlling at least part of a first capacitor cell array and a second capacitor cell array, according to some example embodiments.
Figure 3B:
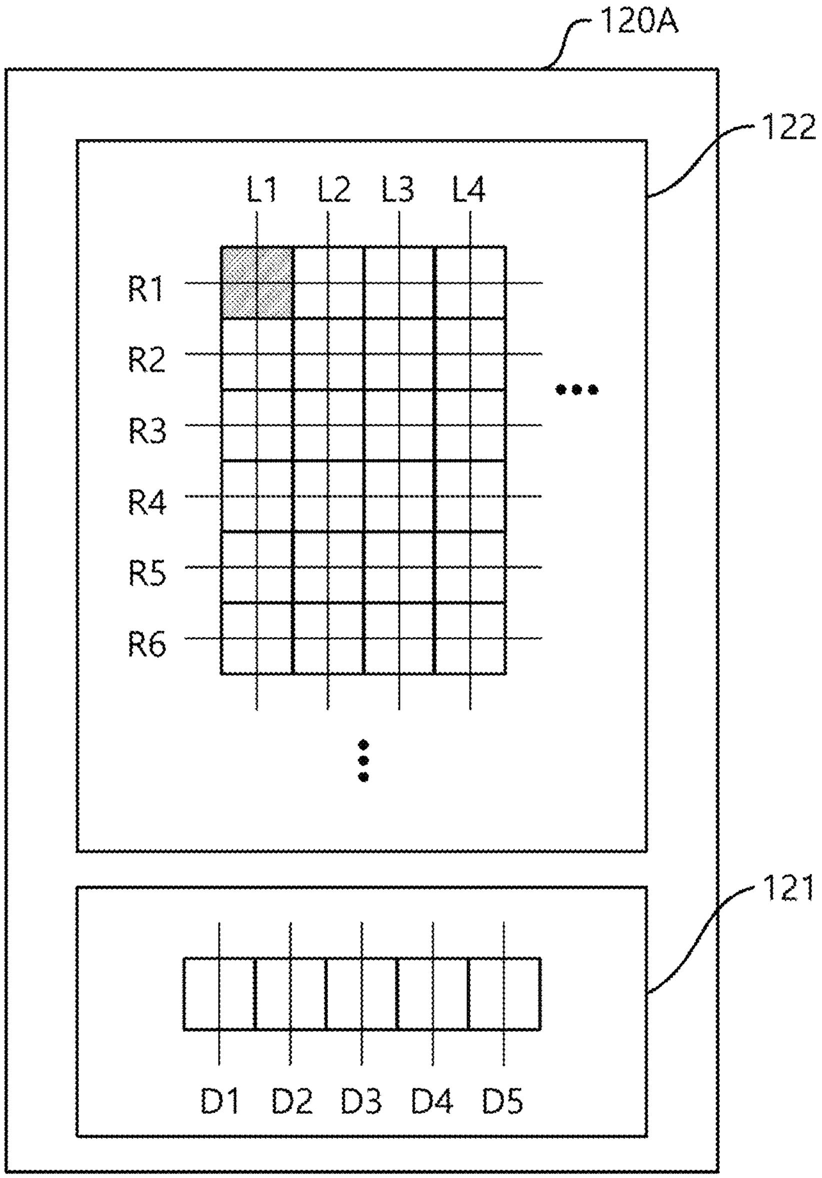
FIG. 3B shows a configuration for controlling at least part of a first capacitor cell array and a second capacitor cell array based on a control code that increases in the configuration of FIG. 3A according to some example embodiments.
Figure 3C:
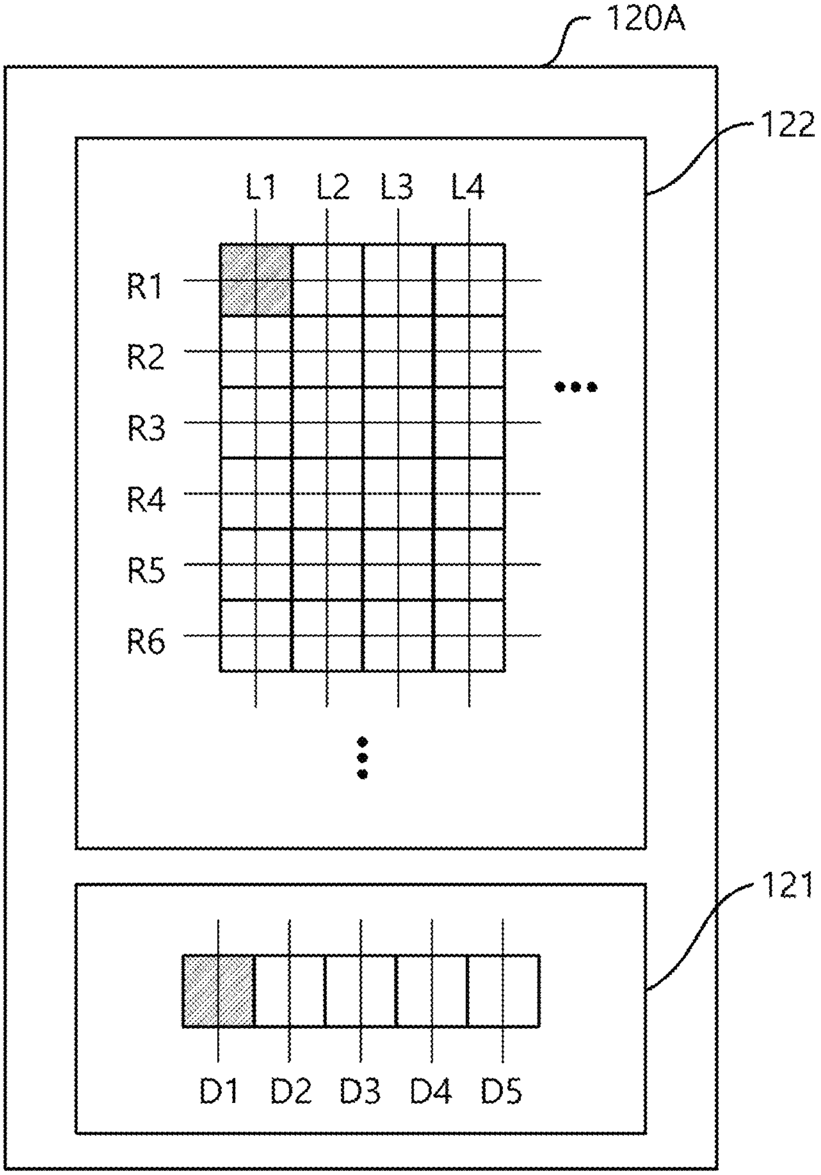
FIG. 3C shows a configuration for controlling at least part of a first capacitor cell array and a second capacitor cell array based on a control code that increases in the configuration of FIG. 3B according to some example embodiments.

FIG. 2 shows a PLL circuit including a first capacitor cell array and a second capacitor cell array, according to some example embodiments. FIG. 3A shows a configuration for controlling at least part of a first capacitor cell array and a second capacitor cell array, according to some example embodiments. FIG. 3B shows a configuration for controlling at least part of a first capacitor cell array and a second capacitor cell array based on a control code that increases in the configuration of FIG. 3A according to some example embodiments. FIG. 3C shows a configuration for controlling at least part of a first capacitor cell array and a second capacitor cell array based on a control code that increases in the configuration of FIG. 3B according to some example embodiments.

Referring to FIG. 2, a PLL circuit 100A according to some example embodiments may include the control logic circuit 110, the oscillator 120, the first decoder 161, a row decoder 211, and a column decoder 212.

Here, it may be understood that the PLL circuit 100A shown in FIG. 2 is an example of the PLL circuit 100 shown in FIG. 1A. Accordingly, the same reference numerals are used for components the same or substantially the same as the above-described components, and descriptions the same as the above-described descriptions are omitted to avoid redundancy.

The control logic circuit 110 may generate the control code CC for selecting at least some of a plurality of capacitor cells C11 to C328 and C1 to C5 depending on the result of comparison between a frequency of the output signal OS and a target frequency.

For example, the control logic circuit 110 may generate the first partial code PC1 for selecting at least one capacitor cell among the plurality of capacitor cells C1 to C5 of the first capacitor cell array 121 in response to the control code CC.

The PLL circuit 100A according to some example embodiments may include a plurality of decoding lines D1 to D5 connected to the plurality of capacitor cells C1 to C5 of the first capacitor cell array 121.

For example, the plurality of capacitor cells C1 to C5 of the first capacitor cell array 121 may be arranged to be connected to the plurality of decoding lines D1 to D5.

Although, in FIGS. 2 to 3C, the first capacitor cell array 121 is shown as including a total of five first to fifth capacitor cells C1 to C5, example embodiments are not limited thereto.

According to some example embodiments, the first capacitor cell array 121 may include three capacitor cells consisting of the first to third capacitor cells C1 to C3.

In some example embodiments, the PLL circuit 100A (or the control logic circuit 110) may include the first decoder 161 connected to the plurality of decoding lines D1 to D5.

According to some example embodiments, the first decoder 161 may select at least some of the plurality of decoding lines D1 to D5.

For example, the first decoder 161 may select at least some of the plurality of decoding lines D1 to D5 based on the first partial code PC1.

According to some example embodiments, the control logic circuit 110 (or the second decoder 162) may generate the second partial code PC2 for selecting at least one capacitor cell among the plurality of capacitor cells C11 to C328 of the second capacitor cell array 122 in response to the control code CC.

In some example embodiments, the PLL circuit 100A may include a plurality of row control lines R1 to R32 connected to the plurality of capacitor cells C11 to C328 of the second capacitor cell array 122. In some example embodiments, the PLL circuit 100A may include a plurality of column control lines L1 to L8 connected to the plurality of capacitor cells C11 to C328 of the second capacitor cell array 122.

For example, the plurality of capacitor cells C11 to C328 of the second capacitor cell array 122 may be arranged to be connected to the plurality of row control lines R1 to R32 and the plurality of column control lines L1 to L8.

In some example embodiments, the PLL circuit 100A may include a row decoder 211 connected to the plurality of row control lines R1 to R32.

According to some example embodiments, the row decoder 211 may select at least some of the plurality of row control lines R1 to R32.

For example, the row decoder 211 may select at least some of the plurality of row control lines R1 to R32 by decoding the second partial code PC2 transmitted from the control logic circuit 110.

According to some example embodiments, the second partial code PC2 may include a row component PC2$x$ for selecting at least some of the plurality of row control lines R1 to R32.

Accordingly, the row decoder 211 may select at least some of the plurality of row control lines R1 to R32 by decoding the row component PC2$x$ of the second partial code PC2 delivered and/or received from the control logic circuit 110.

In some example embodiments, the PLL circuit 100A may include the column decoder 212 connected to the plurality of column control lines L1 to L8.

For example, the column decoder 212 may select at least some of the plurality of column control lines L1 to L8 by decoding the second partial code PC2 transmitted, provided, or sent from the control logic circuit 110.

For example, the second partial code PC2 thus delivered may include a column component PC2*y* for selecting at least some of the plurality of column control lines L1 to L8.

Accordingly, the column decoder 212 may select at least some of the plurality of column control lines L1 to L8 by decoding the column component PC2*y* of the second partial code PC2 delivered from the control logic circuit 110.

In some example embodiments, the control logic circuit 110 may control the capacitor cells selected by the first decoder 161, the row decoder 211, and the column decoder 212.

According to some example embodiments, the control logic circuit 110 may turn on the capacitor cells selected by the first decoder 161, the row decoder 211, and the column decoder 212.

According to some example embodiments, the control logic circuit 110 may turn off the capacitor cells selected by the first decoder 161, the row decoder 211, and the column decoder 212.

However, below, for convenience of description, it is assumed that the operation in which the control logic circuit 110 controls the selected capacitor cells is an operation of turning on the selected capacitor cells.

Referring to FIGS. 3A to 3C together, the control logic circuit 110 according to some example embodiments may control at least some capacitor cells, which are selected by the control code CC, from among the first capacitor cell array 121 and the second capacitor cell array 122.

According to some example embodiments, the control logic circuit 110 may control the first capacitor cell array 121 and the second capacitor cell array 122 based on the result of dividing the control code CC by the first integer.

For example, among the capacitor cells C11 to Cmn of the second capacitor cell array 122, the control logic circuit 110 may control the same number of capacitor cells as the quotient obtained by dividing the control code CC by the first integer (e.g., "4").

Moreover, according to some example embodiments, among the capacitor cells C1 to Ck of the first capacitor cell array 121, the control logic circuit 110 may control the same number of capacitor cells as the remainder obtained by dividing the control code CC by the first integer.

For example, the first integer may be referenced as a ratio of capacitance changes as one capacitor cell is controlled in each of the first capacitor cell array 121 and the second capacitor cell array 122.

For example, referring to FIG. 3A, the control logic circuit 110 may select the first to third capacitor cells C1 to C3 of the first capacitor cell array 121 through the first to third decoding lines D1 to D3 based on a control code of "3".

Here, the control logic circuit 110 according to some example embodiments may turn on the selected first to third capacitor cells C1 to C3.

Accordingly, in some example embodiments, the control logic circuit 110 may increase the capacitance of the oscillator 120 by three times the unit capacitance in response to the control code CC of "3".

In some example embodiments, when a difference between the frequency of the output signal OS and the target frequency exceeds a predetermined, or alternatively desired difference in a state where the first to third capacitor cells C1 to C3 are turned on, the control logic circuit 110 may generate a control code of "4".

Referring to FIG. 3B, the control logic circuit 110 may select the 1-1st capacitor cell C11 of the second capacitor cell array 122 through the first row control line R1 and the first column control line L1 based on the control code of "4".

For example, the control logic circuit 110 according to some example embodiments may turn on the selected 1-1st capacitor cell C11.

Accordingly, in some example embodiments, the control logic circuit 110 may increase the capacitance of the oscillator 120 by four times the unit capacitance in response to the control code CC of "4".

According to some example embodiments, when a difference between the frequency of the output signal OS and the target frequency exceeds a predetermined, or alternatively desired difference in a state where the 1-1st capacitor cell C11 is turned on, the control logic circuit 110 may generate a control code of "5".

Referring to FIG. 3C, the control logic circuit 110 may select the 1-1st capacitor cell C11 of the second capacitor cell array 122 through the first row control line R1 and the first column control line L1 based on the control code of "5".

For example, the control logic circuit 110 may select the first capacitor cell C1 of the first capacitor cell array 121 through the first decoding line D1 based on the control code of "5".

For example, the control logic circuit 110 according to some example embodiments may turn on the selected 1-1st capacitor cell C11 and the selected first capacitor cell C1.

In some example embodiments, the oscillator 120 may output the output signal OS with a specified, or alternatively desired frequency through an electrical path including the turned-on capacitor cells.

Referring to the above-mentioned example embodiments, the control logic circuit 110 may control the first capacitor cell array 121 and the second capacitor cell array 122, which have different capacitance changes from each other, in response to the control code CC composed of a thermometer code.

In some example embodiments, the control logic circuit 110 may control the frequency of the output signal OS output through the oscillator 120 by controlling the first capacitor cell array 121 and the second capacitor cell array 122, which have different capacitance changes from each other.

For example, the first capacitor cell array 121 may be composed of the capacitor cells C1 to C5, which have the same capacitance change as unit capacitance corresponding to the control code CC.

In some example embodiments, the second capacitor cell array 122 may be composed of the capacitor cells C11 to C328, each of which has a capacitance change of an integer multiple (e.g., four times) of the unit capacitance corresponding to the control code CC.

In other words, according to some example embodiments, the control logic circuit 110 may control the capacitance of the oscillator 120 by the capacitance corresponding to the control code CC by using the first capacitor cell array 121 and the second capacitor cell array 122, which have different capacitance changes from each other.

According to the above-mentioned example embodiments, compared to the case of including the number of capacitor cells corresponding to the control code CC, the oscillator 120 according to some example embodiments of the present inventive concepts may be composed of the relatively small number of capacitor cells.

In this way, the PLL circuit 100A according to some example embodiments of the present inventive concepts may minimize the area of the oscillator 120.

Figure 4A:
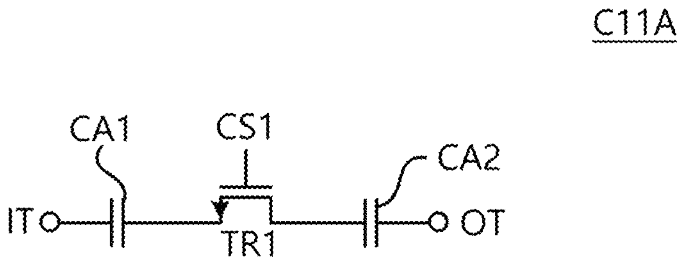
FIG. 4A is a circuit diagram showing a configuration of a capacitor cell, according to some example embodiments.
Figure 4B:
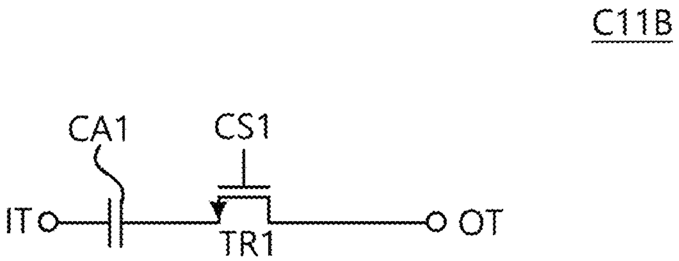
FIG. 4B is a circuit diagram showing a configuration of a capacitor cell, according to some example embodiments.
Figure 5A:
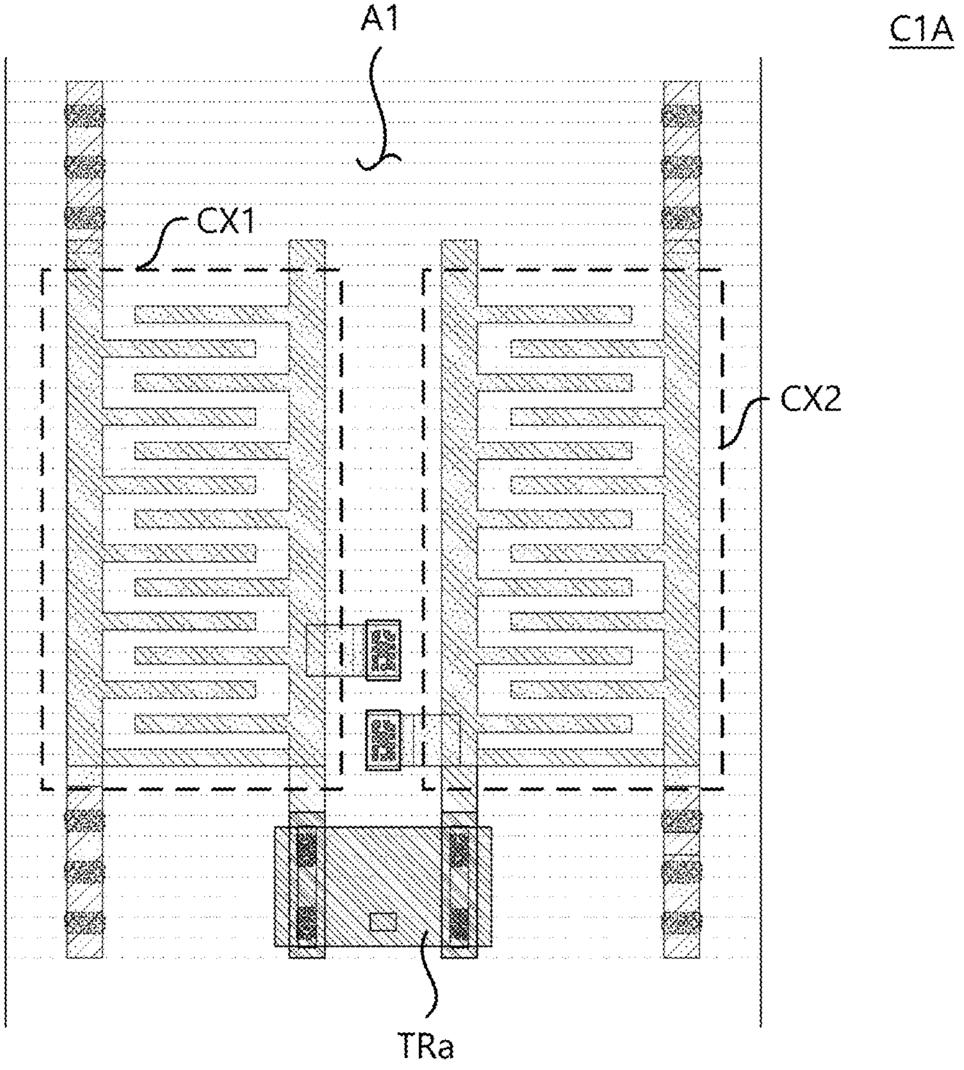
FIG. 5A is a layout showing a capacitor cell included in a first capacitor cell array, according to some example embodiments.
Figure 5B:
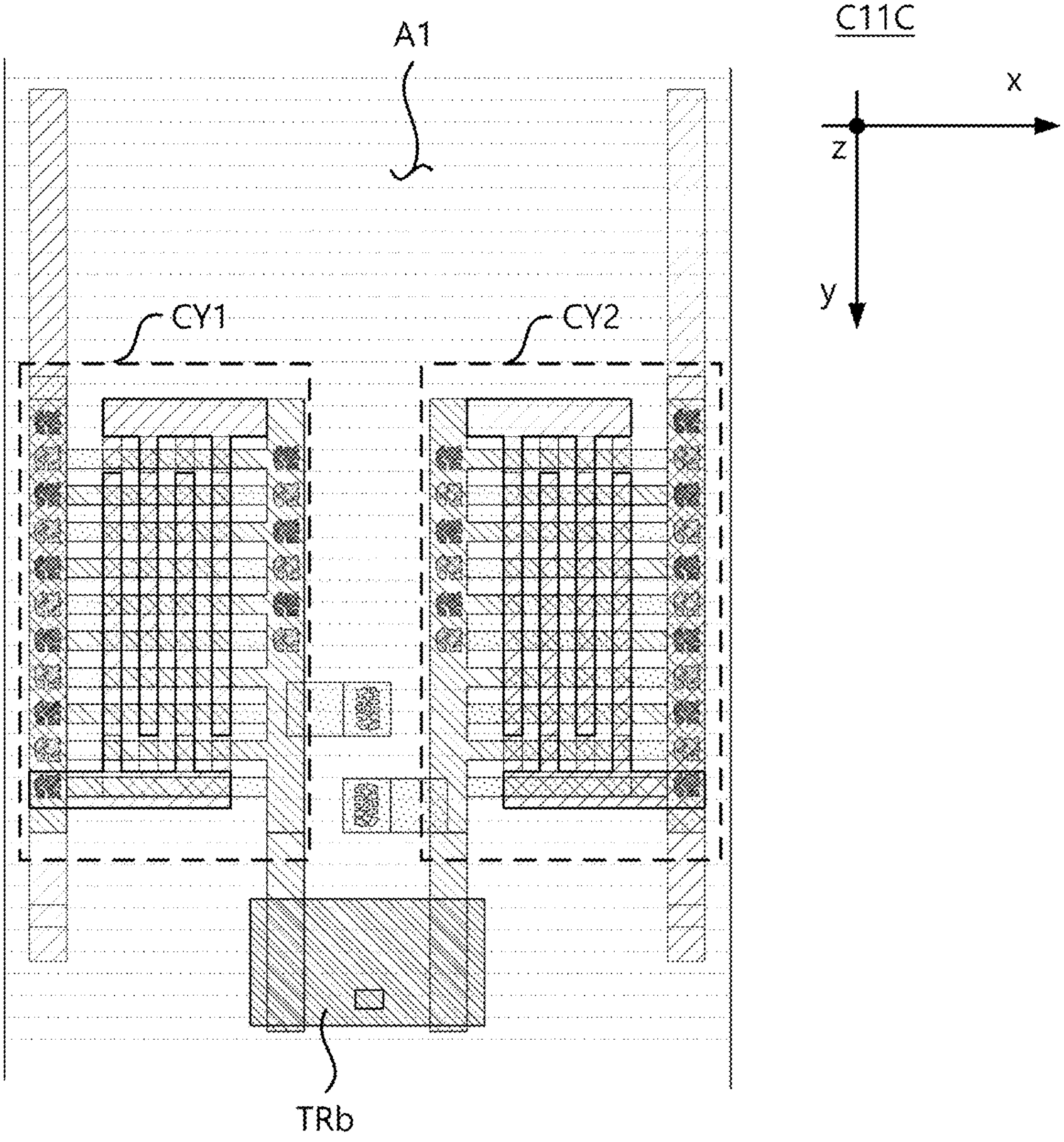
FIG. 5B is a layout showing a capacitor cell included in a second capacitor cell array, according to some example embodiments.

FIG. 4A is a circuit diagram showing a configuration of a capacitor cell, according to some example embodiments. FIG. 4B is a circuit diagram showing a configuration of a capacitor cell, according to some example embodiments. FIG. 5A is a layout showing a capacitor cell included in a first capacitor cell array, according to some example embodiments. FIG. 5B is a layout showing a capacitor cell included in a second capacitor cell array, according to some example embodiments.

Referring to FIGS. 4A and 4B together, capacitor cells included in the oscillator 120 according to some example embodiments may include at least one capacitor and a transistor.

Referring to FIG. 4A according to some example embodiments, a 1-1st capacitor cell C11A may include a first capacitor CA1, a second capacitor CA2, and a first transistor TR1.

Here, the 1-1st capacitor cell C11A may be referenced as an example of the 1-1st capacitor cell C11 connected to the first row control line R1 and the first column control line L1 of FIG. 2.

According to some example embodiments, the 1-1st capacitor cell C11A may include the first capacitor CA1 and the second capacitor CA2 connected in series with each other.

For example, the 1-1st capacitor cell C11A may include the first capacitor CA1 connected to an input terminal IT. For example, the 1-1st capacitor cell C11A may include the second capacitor CA2 connected to an output terminal OT.

In some example embodiments, the 1-1st capacitor cell C11A may include the first transistor TR1 connected between the first capacitor CA1 and the second capacitor CA2.

The control logic circuit 110 may control the first transistor TR1 included in the 1-1st capacitor cell C11A. For example, the control logic circuit 110 may control the 1-1st capacitor cell C11A through the first transistor TR1.

According to some example embodiments, the control logic circuit 110 may turn on the first transistor TR1 in response to the 1-1st capacitor cell C11A being selected by the row decoder 211 and the column decoder 212.

For example, the control logic circuit 110 may provide a first signal CS1 of a high level (e.g., a logic "1") to a gate electrode of the first transistor TR1 in response to the 1-1st capacitor cell C11A being selected by the row decoder 211 and the column decoder 212.

Accordingly, in some example embodiments, the control logic circuit 110 may connect the first capacitor CA1 and the second capacitor CA2.

For example, the state in which the input terminal IT and the output terminal OT are connected through the first capacitor CA1 and the second capacitor CA2 may be referred to as a "state in which the 1-1st capacitor cell C11A is turned on (or activated)".

According to some example embodiments, the control logic circuit 110 may turn off the first transistor TR1 in response to the 1-1st capacitor cell C11A being selected by the row decoder 211 and the column decoder 212.

Accordingly, in some example embodiments, the control logic circuit 110 may disconnect the input terminal IT from the output terminal OT.

For example, the state in which the input terminal IT and the output terminal OT are disconnected by the first transistor TR1 may be referred to as a "state in which the 1-1st capacitor cell C11A is turned off (or deactivated)".

According to some example embodiments, each of the plurality of capacitor cells C11 to C328 and C1 to C5 included in the oscillator 120 may be referenced as having substantially the same structure as the 1-1st capacitor cell C11A.

Referring to FIG. 4B according to some example embodiments, a 1-1st capacitor cell C11B may include the first transistor TR1 and the first capacitor CA1.

For example, the 1-1st capacitor cell C11B may be referenced as an example of the 1-1st capacitor cell C11 connected to the first row control line R1 and the first column control line L1 of FIG. 2.

In some example embodiments, the 1-1st capacitor cell C11B may include the first capacitor CA1 connected to the input terminal IT.

The 1-1st capacitor cell C11B may include the first transistor TR1 connected between the first capacitor CA1 and the output terminal OT.

The control logic circuit 110 may control the first transistor TR1 included in the 1-1st capacitor cell C11B. The control logic circuit 110 may control the 1-1st capacitor cell C11B through the first transistor TR1.

According to some example embodiments, the control logic circuit 110 may turn on the first transistor TR1 in response to the 1-1st capacitor cell C11B being selected by the row decoder 211 and the column decoder 212.

For example, the control logic circuit 110 may provide, transmit, send, or transfer the first signal CS1 of a high level (e.g., a logic "1") to a gate electrode of the first transistor TR1 in response to the 1-1st capacitor cell C11B being selected by the row decoder 211 and the column decoder 212.

Accordingly, in some example embodiments, the control logic circuit 110 may connect the input terminal IT and the output terminal OT of the 1-1st capacitor cell C11B through the first capacitor CA1. Here, the state in which the first capacitor CA1 is grounded may be referred to as a "state in which the 1-1st capacitor cell C11B is turned on (or activated)".

According to some example embodiments, the control logic circuit 110 may turn off the first transistor TR1 in response to the 1-1st capacitor cell C11B being selected by the row decoder 211 and the column decoder 212.

Accordingly, in some example embodiments, the control logic circuit 110 may disconnect the input terminal IT from the output terminal OT.

Here, the state in which the input terminal IT and the output terminal OT are disconnected through the first transistor TR1 may be referred to as a "state in which the 1-1st capacitor cell C11B is turned off (or deactivated)".

According to some example embodiments, the oscillator 120 may output the output signal OS through an electrical path including capacitor cells, which are turned on, from among the plurality of capacitor cells C11 to C328.

Accordingly, the control logic circuit 110 may control the frequency of the output signal OS output through the oscillator 120 by controlling at least some of the plurality of capacitor cells C11 to C328 and C to C5.

Referring to FIGS. 5A and 5B together, capacitor cells included in the first capacitor cell array 121 and the second capacitor cell array 122 according to some example embodiments may have the same area as each other.

Referring to FIG. 5A, a first capacitor cell CIA included in the first capacitor cell array 121 according to some example embodiments may include a first connection transistor TRa, a first cell capacitor CX1, and a second cell capacitor CX2.

For example, the first capacitor cell CIA may be understood as an example of the first capacitor cell C1 connected to the first decoding line D1 in FIG. 2.

For example, the first capacitor cell CIA may include the first cell capacitor CX1 and the second cell capacitor CX2, which are connected through the first connection transistor TRa.

According to some example embodiments, each of the first cell capacitor CX1 and the second cell capacitor CX2 may be formed by a plurality of metal branches.

For example, each of the first cell capacitor CX1 and the second cell capacitor CX2 may be referenced as a capacitor having capacitance formed by the plurality of metal branches.

According to some example embodiments, as the first connection transistor TRa is turned on or off by the control logic circuit 110, the capacitance of the first capacitor cell array 121, which includes the first capacitor cell CIA, may change by the first capacitance.

In some example embodiments, the first capacitor cell CIA composed of the first connection transistor TRa, the first cell capacitor CX1, and the second cell capacitor CX2 may be formed to have a first area A1.

Referring to FIG. 5B, a 1-1st capacitor cell C11C included in the second capacitor cell array 122 according to some example embodiments may include a second connection transistor TRb, a first capacitor CY1, and a second capacitor CY2.

Here, it may be understood that the 1-1st capacitor cell C11C is an example of the 1-1st capacitor cell C11 connected to the first row control line R1 and the first column control line L1 of FIG. 2.

In some example embodiments, the 1-1st capacitor cell C11C may include the first capacitor CY1 and the second capacitor CY2, which are connected through the second connection transistor TRb.

In some example embodiments, each of the first capacitor CY1 and the second capacitor CY2 may be formed by a plurality of metal branches.

For example, each of the first capacitor CY1 and the second capacitor CY2 may be referenced as a capacitor having capacitance formed by the plurality of metal branches.

Each of the first capacitor CY1 and the second capacitor CY2 according to some example embodiments may be formed as the plurality of metal branches are stacked to be a plurality of layers.

For example, each of the first capacitor CY1 and the second capacitor CY2 may be formed as the plurality of metal branches formed in a first direction (e.g., +x direction) and a second direction (e.g., +y direction) are stacked in a third direction (e.g., +z direction) to be the plurality of layers.

According to some example embodiments, as the second connection transistor TRb is turned on or off by the control logic circuit 110, the capacitance of the second capacitor cell array 122 including the 1-1st capacitor cell C11C may change by the second capacitance, which is an integer multiple of the first capacitance.

Accordingly, in some example embodiments, the 1-1st capacitor cell C11C composed of the second connection transistor TRb, the first capacitor CY1, and the second capacitor CY2 may be formed to have the first area A1.

In other words, each of the capacitor cells included in the first capacitor cell array 121 and each of the capacitor cells included in the second capacitor cell array 122 may be formed to have the same area (e.g., the first area A1).

Referring to the above-mentioned example embodiments, the oscillator 120 according to some example embodiments may include the first capacitor cell array 121 and the second capacitor cell array 122, each of which is composed of capacitor cells having the same area as each other and different capacitance changes from each other.

The control logic circuit 110 according to some example embodiments may control the capacitance of the oscillator 120 by a magnitude corresponding to the control code CC by using the first capacitor cell array 121 and the second capacitor cell array 122, each of which is composed of capacitor cells with the same area as each other and different capacitance changes from each other.

Accordingly, compared to the case of including the number of capacitor cells corresponding to the control code CC composed of a thermometer code, the oscillator 120 according to some example embodiments of the present inventive concepts may be composed of the relatively small number of capacitor cells.

Accordingly, the PLL circuit 100 according to some example embodiments of the present inventive concepts may minimize the area of the oscillator 120.

Figure 6A:
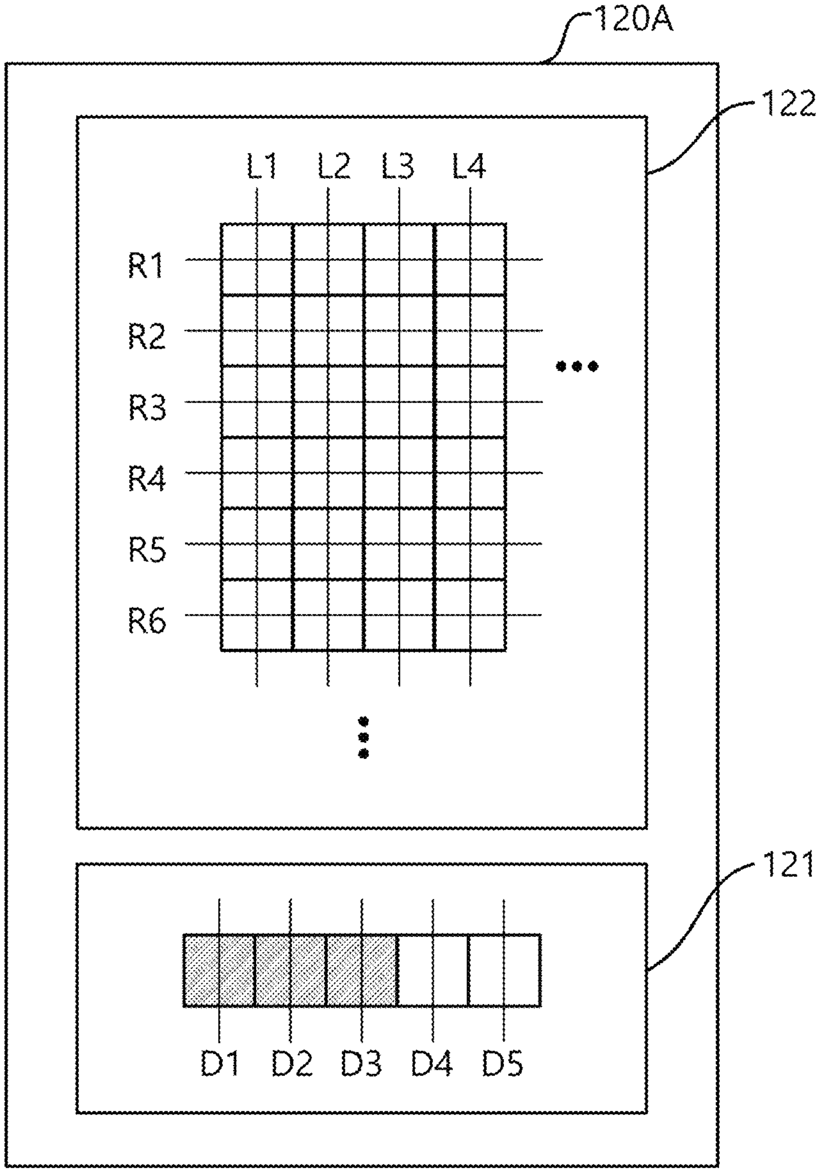
FIG. 6A shows a configuration for controlling at least part of a first capacitor cell array and a second capacitor cell array, according to some example embodiments.
Figure 6B:
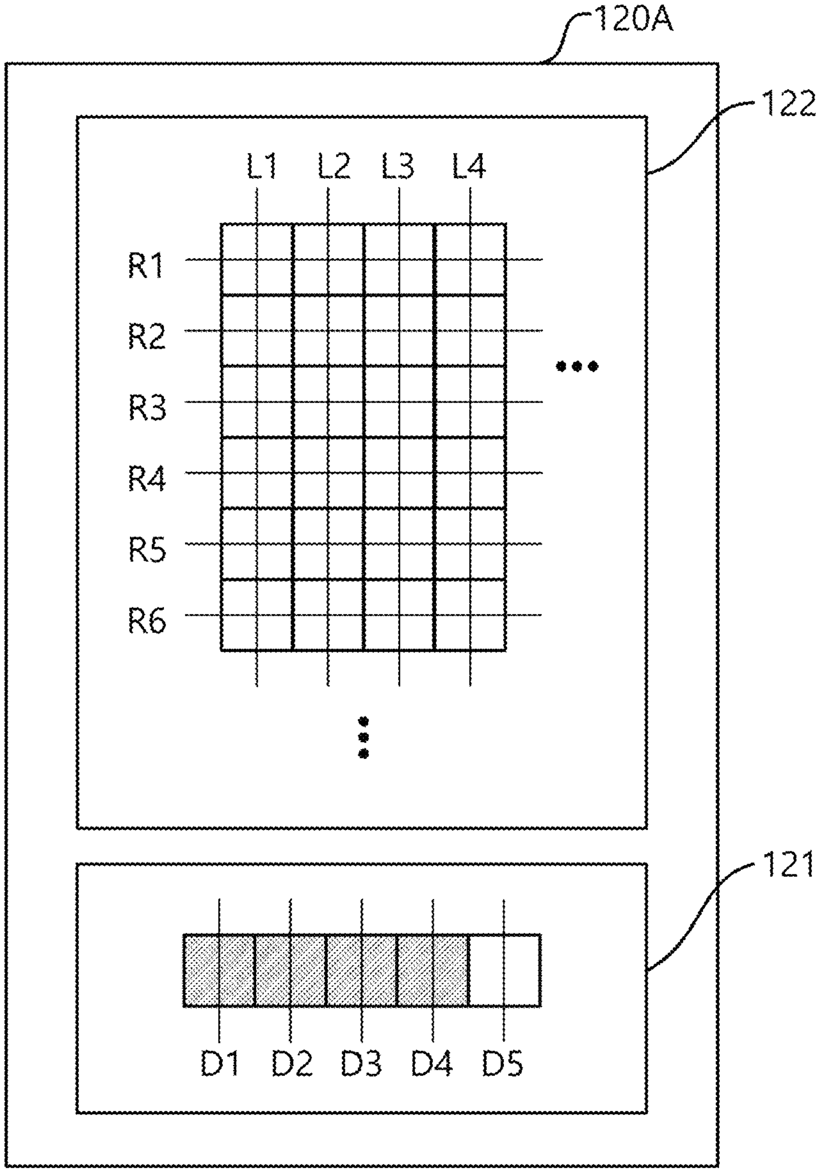
FIG. 6B shows a configuration for controlling at least part of a first capacitor cell array and a second capacitor cell array based on a control code that increases in the configuration of FIG. 6A according to some example embodiments.
Figure 6C:
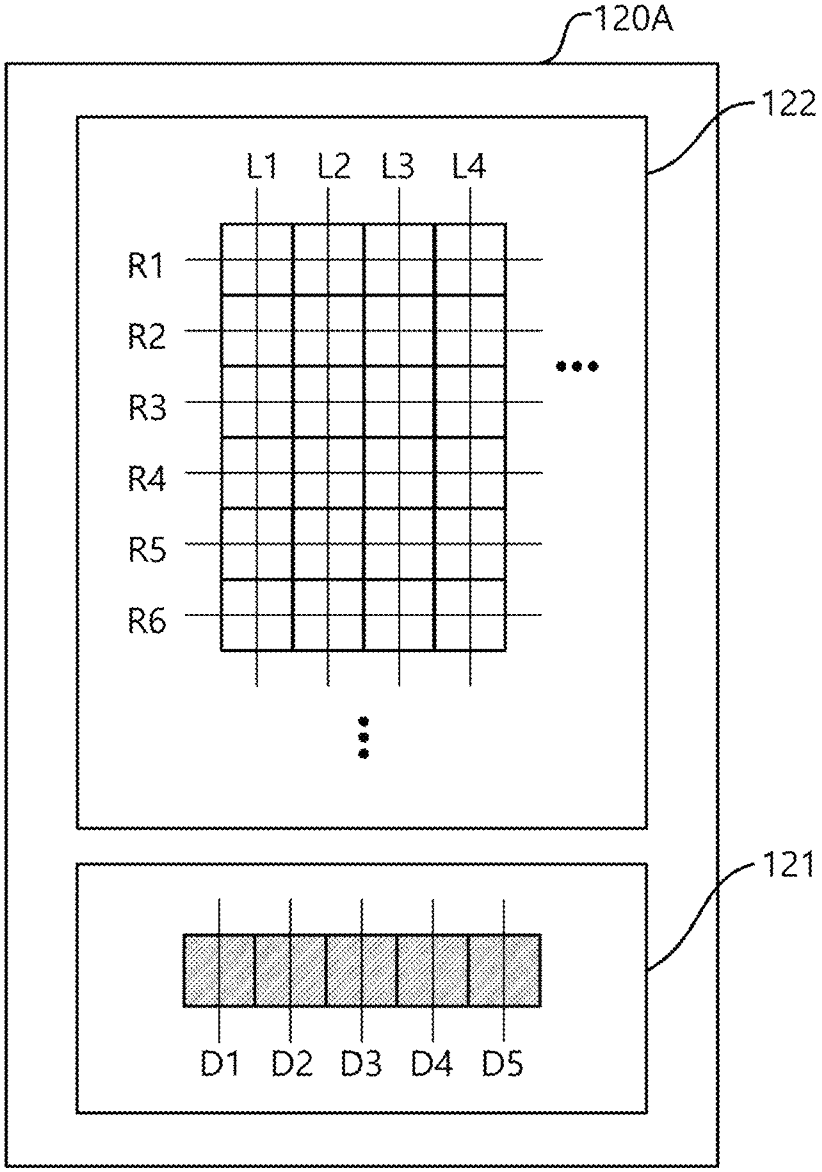
FIG. 6C shows a configuration for controlling at least part of a first capacitor cell array and a second capacitor cell array based on a control code that increases in the configuration of FIG. 6B according to some example embodiments.
Figure 6D:
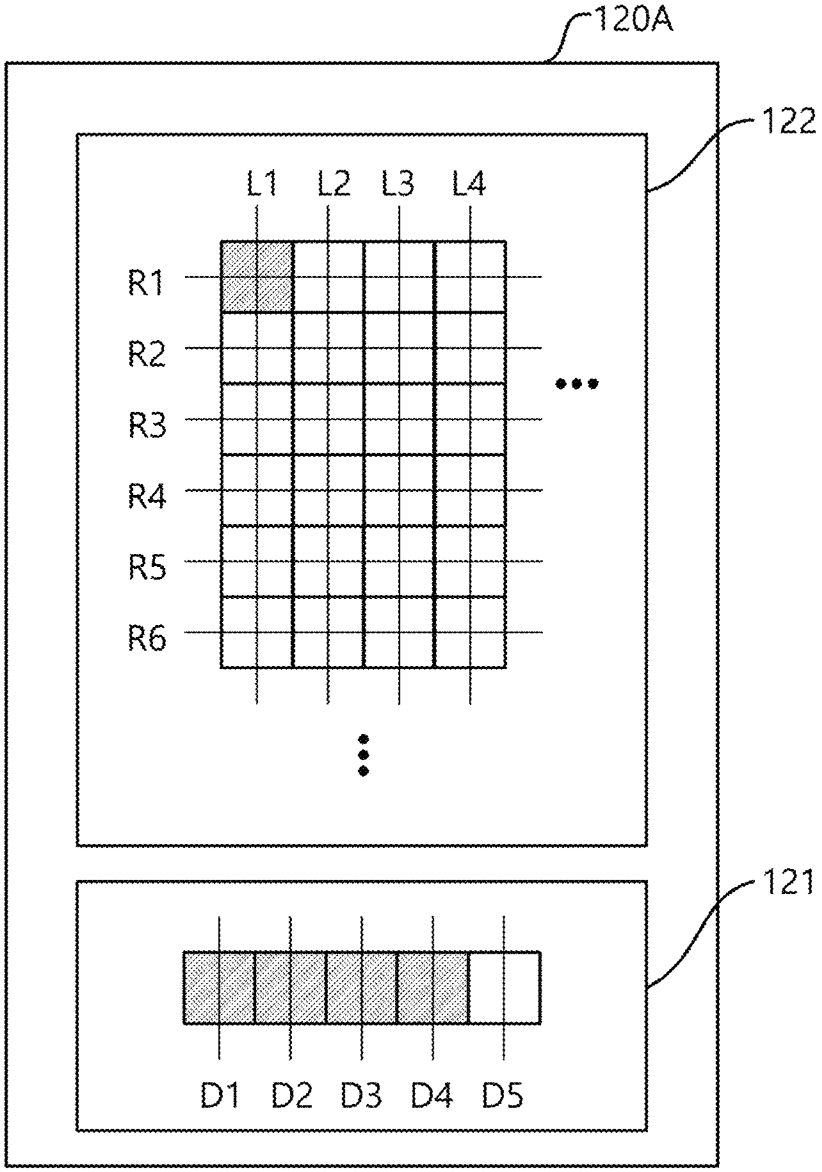
FIG. 6D shows a configuration for controlling at least part of a first capacitor cell array and a second capacitor cell array based on a control code of "8", according to some example embodiments.

FIG. 6A shows a configuration for controlling at least part of a first capacitor cell array and a second capacitor cell array, according to some example embodiments. FIG. 6B shows a configuration for controlling at least part of a first capacitor cell array and a second capacitor cell array based on a control code that increases in the configuration of FIG. 6A according to some example embodiments. FIG. 6C shows a configuration for controlling at least part of a first capacitor cell array and a second capacitor cell array based on a control code that increases in the configuration of FIG. 6B according to some example embodiments. FIG. 6D shows a configuration for controlling at least part of a first capacitor cell array and a second capacitor cell array based on a control code of "8", according to some example embodiments.

Referring to FIGS. 6A to 6D together, the control logic circuit 110 according to some example embodiments may control at least some capacitor cells, which are selected by the control code CC, from among the first capacitor cell array 121 and the second capacitor cell array 122.

According to some example embodiments, the first capacitor cell array 121 may be composed of the first number of capacitor cells. For example, the first capacitor cell array 121 may be composed of five capacitor cells including the first to fifth capacitor cells C1 to C5.

Moreover, it may be understood that the control code CC generated by the control logic circuit 110 is a thermometer code.

According to some example embodiments, when the control code CC is less than or equal to the first number, the control logic circuit 110 may control the number of capacitor cells corresponding to the control code CC among the first capacitor cell array 121.

For example, referring to FIG. 6A, the control logic circuit 110 may select the first to third capacitor cells C1 to C3 of the first capacitor cell array 121 through the first to third decoding lines D1 to D3 based on a control code of "3".

Here, the control logic circuit 110 according to some example embodiments may turn on the selected first to third capacitor cells C1 to C3. Accordingly, in some example embodiments, the control logic circuit 110 may increase the capacitance of the oscillator 120 by three times the unit capacitance in response to the control code CC of "3".

In some example embodiments, when a difference between the frequency of the output signal OS and the target frequency exceeds a predetermined, or alternatively desired difference in a state where the first to third capacitor cells C1 to C3 are turned on, the control logic circuit 110 may generate a control code of "4".

For example, referring to FIG. 6B, the control logic circuit 110 may select the first to fourth capacitor cells C1 to C4 of the first capacitor cell array 121 through the first to fourth decoding lines D1 to D4 based on a control code of "4".

In some example embodiments, the control logic circuit 110 according to some example embodiments may turn on the selected first to fourth capacitor cells C1 to C4. In this way, the control logic circuit 110 may increase the capacitance of the oscillator 120 by four times the unit capacitance in response to the control code CC of "4".

In other words, the control logic circuit 110 may turn on the first to fourth capacitor cells C1 to C4 without turning on the 1-1st capacitor cell C11, in response to the control code CC "4".

In some example embodiments, when a difference between the frequency of the output signal OS and the target frequency exceeds a predetermined, or alternatively desired difference in a state where the first to fourth capacitor cells C1 to C4 are turned on, the control logic circuit 110 may generate a control code of "5".

For example, referring to FIG. 6C, the control logic circuit 110 may select the first to fifth capacitor cells C1 to C5 of the first capacitor cell array 121 through the first to fifth decoding lines D1 to D5 based on the control code of "5".

Here, the control logic circuit 110 according to some example embodiments may turn on the selected first to fifth capacitor cells C1 to C5. Accordingly, the control logic circuit 110 may increase the capacitance of the oscillator 120 by fifth times the unit capacitance in response to the control code CC of "5".

In other words, the control logic circuit 110 may control the first to fifth capacitor cells C1 to C5 without turning on the 1-1st capacitor cell C11, in response to the control code CC "5".

Referring to the above-mentioned example embodiments, the control logic circuit 110 may not control the second capacitor cell array 122, but may control the first capacitor cell array 121 in response to the control code CC (e.g., "4" or "5") that is greater than or equal to the first integer (e.g., "4") or less than or equal to the first number (e.g., "5").

In other words, when the control code CC is greater than or equal to the first integer, the control logic circuit 110 may replace control of one capacitor cell of the second capacitor cell array 122 with control of capacitor cells of the first capacitor cell array 121, of which the number is the first integer.

Accordingly, in some example embodiments, the control logic circuit 110 may reduce linearity deterioration due to mismatch or deviation of a capacitance change between the capacitor cells of the first capacitor cell array 121 and the capacitor cells of the second capacitor cell array 122.

Accordingly, the control logic circuit 110 may improve the linearity of a signal output through the PLL circuit 100.

Moreover, in some example embodiments, when the control code CC is a multiple of the first integer exceeding the first number, the control logic circuit 110 according to some example embodiments may control the first capacitor cell array 121 and the second capacitor cell array 122 based on the result of dividing the control code CC by the first integer.

For example, when the control code CC is a multiple of the first integer exceeding the first number, the control logic circuit 110 may control the same number of capacitor cells as a value, which is obtained by subtracting "1" from a quotient obtained by dividing the control code CC by the first integer, from among capacitor cells included in the second capacitor cell array 122.

In some example embodiments, when the control code CC is a multiple of the first integer exceeding the first number, the control logic circuit 110 may control capacitor cells, of which the number is the first integer, from among the capacitor cells included in the first capacitor cell array 121.

For example, referring to FIG. 6D, the control logic circuit 110 may control the 1-1st capacitor cell C11, of which the number of "1" is obtained by subtracting "1" from a quotient of "2" obtained by dividing the control code CC of "8" by the first integer of "4", based on the control code CC of "8".

For example, the control logic circuit 110 may select and control the 1-1st capacitor cell C11 through the first row control line R1 and the first column control line L1 based on the second partial code PC2 generated based on the control code CC of "8", According to some example embodiments, the control logic circuit 110 may control the first to fourth capacitor cells C1 to C4, of which the number is the first integer of "4", in the first capacitor cell array 121 based on the control code CC of "8".

For example, the control logic circuit 110 may select and control the first to fourth capacitor cells C1 to C4 through the first to fourth decoding lines D1 to D4 based on the first partial code PC1 generated based on the control code CC of "8".

Referring to the above-mentioned example embodiments, the control logic circuit 110 may control capacitor cells, of which the number corresponds to a value obtained by subtracting "1" from a quotient obtained by dividing the control code CC by the first integer, in the second capacitor cell array 122 in response to the control code CC, which is a multiple of the first integer.

Moreover, the control logic circuit 110 may control capacitor cells, of which the number corresponds to the first integer, from among the first capacitor cell array 121, in response to the control code CC, which is a multiple of the first integer.

In other words, the control logic circuit 110 may replace control of one capacitor cell of the second capacitor cell array 122 with control of capacitor cells, of which the number corresponds to the first integer, from among the first capacitor cell array 121 in response to the control code CC, which is a multiple of the first integer.

Accordingly, in some example embodiments, a control logic circuit 110B may reduce linearity deterioration due to mismatch or deviation of a capacitance change between the capacitor cells of the first capacitor cell array 121 and the capacitor cells of the second capacitor cell array 122.

Accordingly, the control logic circuit 110 may improve the linearity of a signal output through the PLL circuit 100.

In some example embodiments, the oscillator 120 may output the output signal OS with a specified, or alternatively desired frequency through an electrical path including turned-on capacitor cells.

Referring to the above-mentioned example embodiments, the control logic circuit 110 may control the first capacitor cell array 121 and the second capacitor cell array 122, which have different capacitance changes from each other, in response to the control code CC composed of a thermometer code.

According to some example embodiments, the control logic circuit 110 may control the frequency of the output signal OS output through the oscillator 120 by controlling the first capacitor cell array 121 and the second capacitor cell array 122, which have different capacitance changes from each other.

Figure 7:
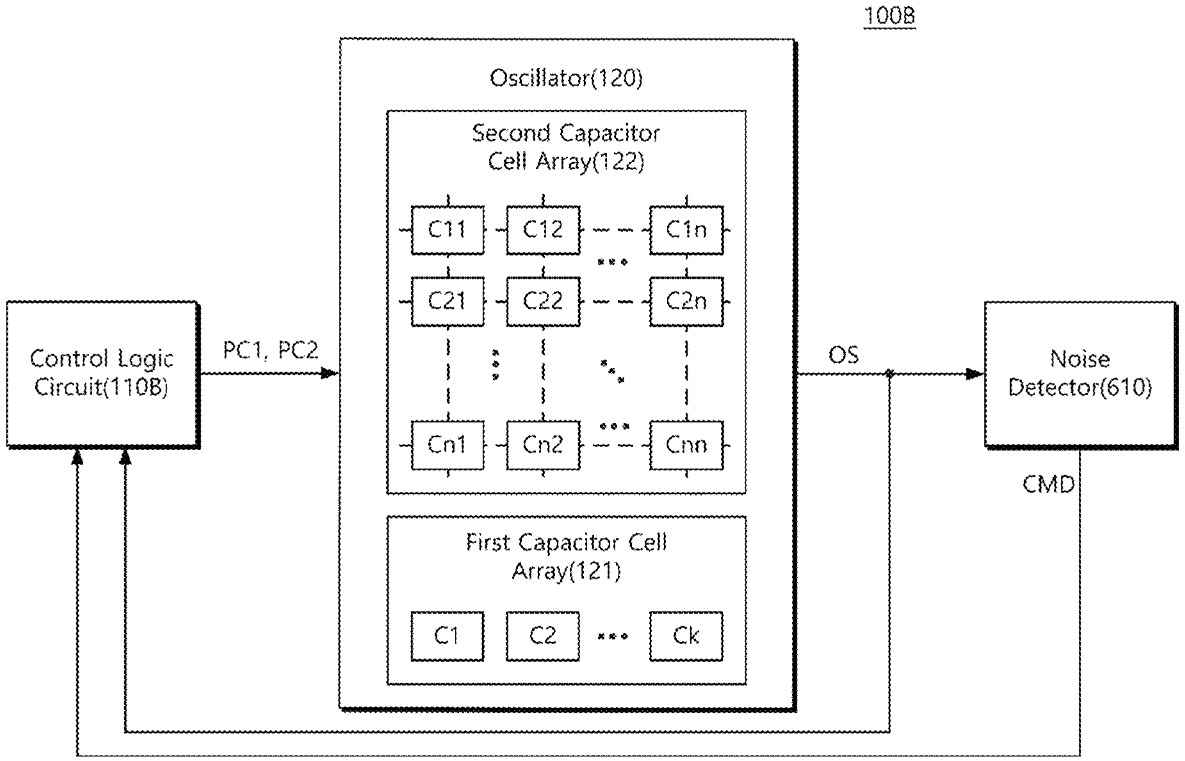
FIG. 7 is a block diagram showing a PLL circuit operating according to a magnitude of noise of a signal output from an oscillator, according to some example embodiments.
Figure 8:
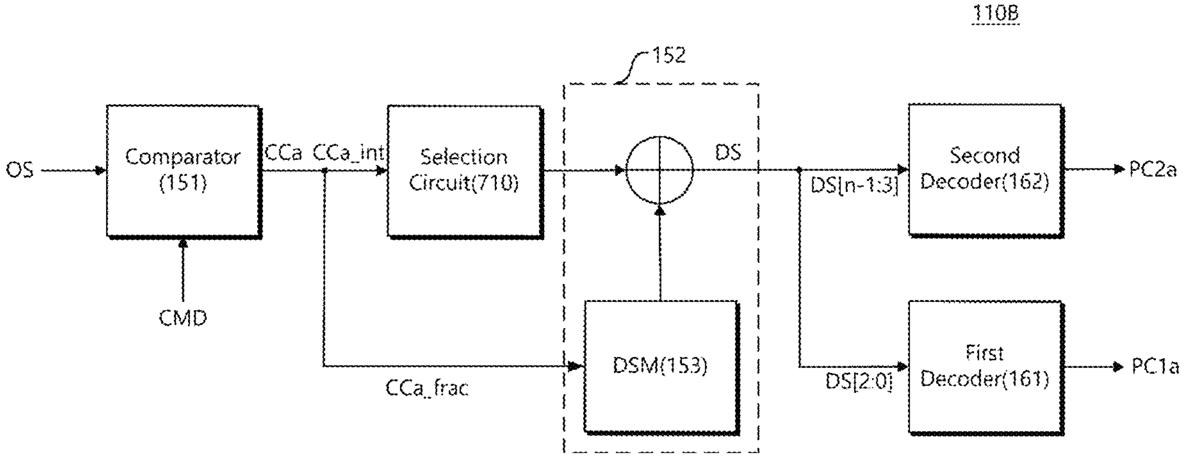
FIG. 8 is a block diagram showing a control logic circuit further including a selection circuit, according to some example embodiments.

FIG. 7 is a block diagram showing a PLL circuit operating according to a magnitude of noise of a signal output from an oscillator, according to some example embodiments. FIG. 8 is a block diagram showing a control logic circuit further including a selection circuit, according to some example embodiments.

Referring to FIGS. 7 to 8 together, a PLL circuit 100B according to some example embodiments may include the control logic circuit 110B, the oscillator 120, and a noise detector 610. In some example embodiments, the control logic circuit 110B may include the comparator 151, the dithering circuit 152, the first decoder 161, the second decoder 162, and a selection circuit 710.

Here, it may be understood that the PLL circuit 100B and the control logic circuit 110B shown in FIGS. 7 and 8 are examples of the PLL circuit 100 and the control logic circuit 110 shown in FIG. 1A. Accordingly, the same reference numerals are used for components the same or substantially the same as the above-described components, and descriptions the same as the above-described example embodiments are omitted to avoid redundancy.

The PLL circuit 100B may also be referred to as a "PLL device" or "clock signal generation circuit".

According to some example embodiments, the PLL circuit 100B may further include the noise detector 610, which detects noise of the output signal OS.

For example, the noise detector 610 may receive the output signal OS received from the oscillator 120. In some example embodiments, the noise detector 610 may determine the noise (or noise level) of the output signal OS.

For example, the noise detector 610 may determine the noise of the output signal OS by comparing the output signal OS received from the oscillator 120 with a reference signal.

The noise detector 610 according to some example embodiments may output a control signal CMD based on the noise of the output signal OS.

For example, the noise detector 610 may output the control signal CMD for controlling the operation of the control logic circuit 110B based on whether the determined noise of the output signal OS is greater than or equal to a predetermined, or alternatively desired threshold value.

According to some example embodiments, the control logic circuit 110B may operate in different modes based on the control signal CMD output from the noise detector 610. For example, the control logic circuit 110B may operate in a first mode or a second mode, which are different from each other, based on the control signal CMD according to the noise of the output signal OS.

Referring to FIG. 8, the control logic circuit 110B may further include the selection circuit 710 connected in series between the comparator 151 and the dithering circuit 152.

For example, the comparator 151 may generate a control code CCa based on the output signal OS and the control signal CMD. For example, the comparator 151 may generate the control code CCa by comparing the frequency of the output signal OS with a target frequency.

According to some example embodiments, the control code CCa may include data according to the comparison result between the frequency of the output signal OS and the target frequency. In some example embodiments, the control code CCa may include data for controlling the selection circuit 710, which is generated based on the control signal CMD.

According to some example embodiments, the selection circuit 710 may transmit, provide, or send different numbers of bits to the first decoder 161 and the second decoder 162 based on the control code CCa.

For example, the selection circuit 710 may operate such that the specified number of bits of the control code CCa is delivered to the first decoder 161 and the second decoder 162, based on an integer bit CCa_int of the control code CCa. In some example embodiments, the DSM 153 of the dithering circuit 152 may dither and output a fractional bit CCa_frac of the control code CCa.

For example, when the noise of the output signal OS is less than a threshold, or alternatively desired value, the selection circuit 710 may transmit, provide, or send two bits [1:0] of the control code CCa to the first decoder 161 through the dithering circuit 152 such that the control logic circuit 110B operates in a first mode.

For example, when the noise of the output signal OS is less than the threshold, or alternatively desired value, the first decoder 161 may generate a first partial code PC1*a* by decoding two bits DS[1:0] of the dithering signal DS.

In some example embodiments, when the noise of the output signal OS is less than the threshold, or alternatively desired value, the selection circuit 710 may transmit, provide, or send bits [n−1:2] other than the two bits of the control code CCa to the second decoder 162 through the dithering circuit 152 such that the control logic circuit 110B operates in the first mode.

In some example embodiments, when the noise of the output signal OS is less than the threshold, or alternatively desired value, the second decoder 162 may generate a second partial code PC2*a* by decoding the bits DS[n−1:2] other than the two bits DS[1:0] of the dithering signal DS.

According to some example embodiments, when the noise of the output signal OS is greater than or equal to the threshold value, the selection circuit 710 may transmit, provide, or send three bits [2:0] of the control code CCa to the first decoder 161 through the dithering circuit 152 such that the control logic circuit 110B operates in a second mode.

In some example embodiments, when the noise of the output signal OS is greater than or equal to the threshold value, the first decoder 161 may generate the first partial code PC1*a* by decoding the three bits DS[2:0] of the dithering signal DS.

In some example embodiments, when the noise of the output signal OS is greater than or equal to the threshold value, the selection circuit 710 may transmit, provide, or send bits [n−1:3] other than three bits of the control code CCa to the second decoder 162 through the dithering circuit 152 such that the control logic circuit 110B operates in the second mode.

In some example embodiments, when the noise of the output signal OS is greater than or equal to the threshold value, the second decoder 162 may generate the second partial code PC2*a* by decoding the bits DS[n−1:3] other than three bits DS[2:0] of the dithering signal DS.

According to some example embodiments, when the noise of the output signal OS is less than the threshold value, the control logic circuit 110B may operate in the first mode for controlling the first capacitor cell array 121 and the second capacitor cell array 122 based on the first partial code PC1*a* and the second partial code PC2*a*, which correspond to the results of dividing the control code CCa by the first integer.

For example, the first integer may be referenced as a ratio of capacitance changes between capacitor cells included in each of the first capacitor cell array 121 and the second capacitor cell array 122.

According to some example embodiments, when the noise of the output signal OS is less than the threshold value, the control logic circuit 110B may control the same number of capacitor cells as a quotient obtained by dividing the control code CC by the first integer among the second capacitor cell array 122.

In some example embodiments, when the noise of the output signal OS is less than the threshold value, the control logic circuit 110B may control at least part of the second capacitor cell array 122 based on the second partial code PC2*a*, which corresponds to the quotient obtained by dividing the control code CC by the first integer.

In some example embodiments, the control logic circuit 110B may control the same number of capacitor cells as a remainder, which is obtained by dividing the control code CC by the first integer, from among the first capacitor cell array 121.

In some example embodiments, when the noise of the output signal OS is less than the threshold value, the control logic circuit 110B may control at least some of the first capacitor cell array 121 based on the first partial code PC1*a*, which corresponds to the remainder obtained by dividing the control code CC by the first integer.

It may be understood that an operation in which the control logic circuit 110B controls the oscillator 120 while operating in the first mode when the noise of the output signal OS is less than the threshold value is substantially the same as an operation in which the control logic circuit 110B controls the first capacitor cell array 121 and the second capacitor cell array 122 in FIGS. 3A to 3C.

Referring to the above-mentioned example embodiments, the control logic circuit 110B according to some example embodiments may output a signal with a target frequency by using the oscillator 120 composed of the relatively small number of capacitor cells compared to a case where the number of capacitor cells corresponding to each of the control code CCa is provided.

Accordingly, the PLL circuit 100B according to some example embodiments of the present inventive concepts may minimize the area of the oscillator 120.

On the other hand, according to some example embodiments, when the noise of the output signal OS is greater than or equal to the threshold value, the control logic circuit 110B may operate in the second mode for controlling the first capacitor cell array 121 and the second capacitor cell array 122 based on the number of capacitor cells included in the first capacitor cell array 121 and the control code CC.

Here, it is assumed that the first capacitor cell array 121 is composed of 5 capacitor cells.

According to some example embodiments, when the control code CCa is less than or equal to the first number, the control logic circuit 110B may control the number of capacitor cells corresponding to the control code CCa among the first capacitor cell array 121.

For example, when the control code CCa is less than or equal to the first number, the control logic circuit 110B may control the number of capacitor cells corresponding to the control code CCa among the first capacitor cell array 121 based on the first partial code PC1*a*.

In some example embodiments, when the control code CCa is a multiple of the first integer exceeding the first number, the control logic circuit 110B according to some example embodiments may control the first capacitor cell array 121 and the second capacitor cell array 122 based on the result of dividing the control code CCa by the first integer.

For example, when the control code CCa is a multiple of the first integer exceeding the first number, the control logic circuit 110B may control the same number of capacitor cells as a value, which is obtained by subtracting “1” from a quotient obtained by dividing the control code CCa by the first integer, from among capacitor cells included in the second capacitor cell array 122.

For example, when the control code CCa is a multiple of the first integer exceeding the first number, the control logic circuit 110B may control the same number of capacitor cells as a value, which is obtained by subtracting “1” from the quotient obtained by dividing the control code CCa by the first integer, in the second capacitor cell array 122 based on the second partial code PC2*a*.

In some example embodiments, when the control code CCa is a multiple of the first integer exceeding the first number, the control logic circuit 110B may control capacitor cells, of which the number is the first integer, from among the capacitor cells included in the first capacitor cell array 121.

For example, when the control code CCa is a multiple of the first integer exceeding the first number, the control logic circuit 110B may control capacitor cells, of which the number is the first integer, from among the capacitor cells included in the first capacitor cell array 121 based on the first partial code PC1*a*.

Referring to the above-mentioned example embodiments, it may be understood that an operation in which the control logic circuit 110B controls the oscillator 120 while operating in the second mode when the noise of the output signal OS is greater than or equal to the threshold value is substantially the same as an operation in which the control logic circuit 110B controls the first capacitor cell array 121 and the second capacitor cell array 122 in FIGS. 6A to 6D.

According to some example embodiments, the control logic circuit 110B may not control the second capacitor cell array 122, but may control the first capacitor cell array 121 in response to the control code CCa (e.g., “4” or “5”) that is greater than or equal to the first integer (e.g., “4”) or less than or equal to the first number (e.g., “5”).

For example, when the control code CC is greater than or equal to the first integer, the control logic circuit 110 may replace control of one capacitor cell of the second capacitor cell array 122 with control of capacitor cells of the first capacitor cell array 121, of which the number is the first integer.

Accordingly, in some example embodiments, the control logic circuit 110B may reduce linearity deterioration due to mismatch or deviation of a capacitance change between the capacitor cells of the first capacitor cell array 121 and the capacitor cells of the second capacitor cell array 122.

Accordingly, the control logic circuit 110B may improve the linearity of a signal output through the PLL circuit 100B.

Figure 9:
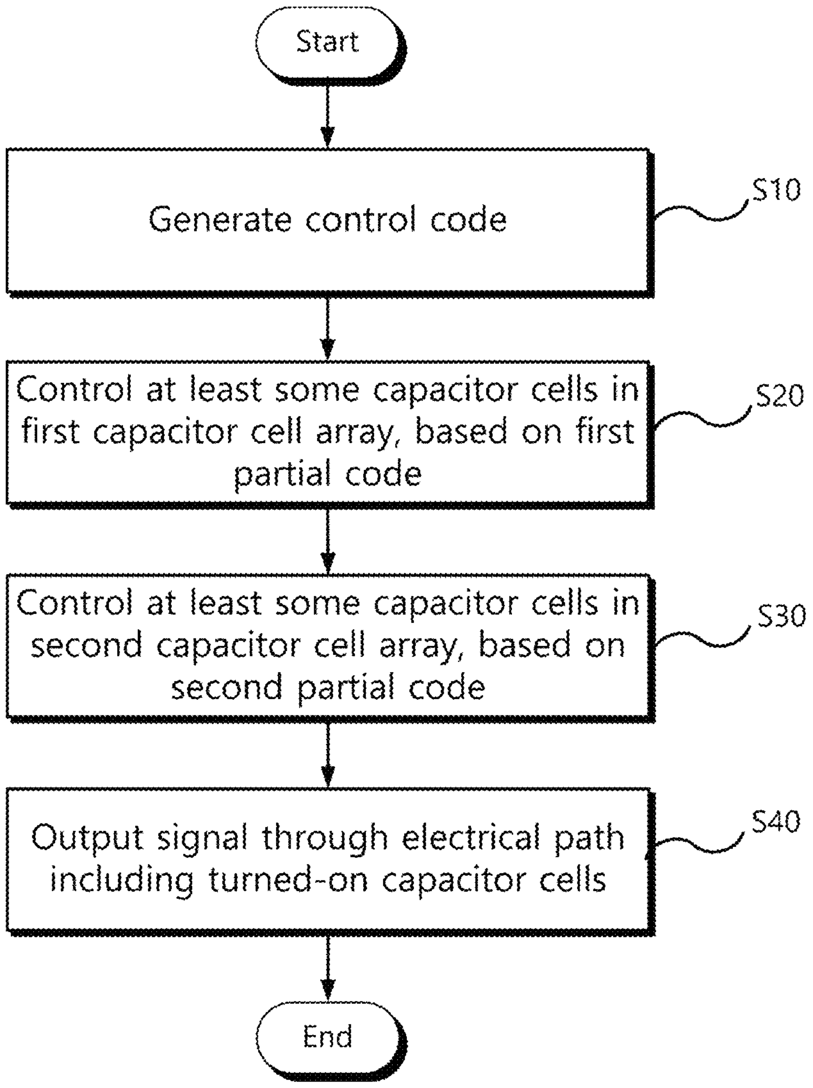
FIG. 9 is a flowchart showing a method for controlling a PLL circuit, according to some example embodiments.

FIG. 9 is a flowchart showing a method for controlling a PLL circuit, according to some example embodiments.

Referring to FIG. 9, the control logic circuit 110 according to some example embodiments may control capacitor cell arrays composed of capacitor cells with different capacitance changes from each other based on the control code CC.

In operation S10, the control logic circuit 110 according to some example embodiments may generate the control code CC.

For example, the control logic circuit 110 may generate the control code CC for controlling the oscillator 120 by comparing the first frequency of the first signal output from the oscillator 120 with a target frequency.

For example, the control logic circuit 110 may generate the control code CC for controlling at least one capacitor cell, which is included in the oscillator 120, by comparing the first frequency of the first signal output from the oscillator 120 with the target frequency.

In some example embodiments, the control logic circuit 110 may generate the first partial code PC1 by using the specified number of bits of the control code CC. In some example embodiments, the control logic circuit 110 may generate the second partial code PC2 by using bits other than the specified number of bits of the control code CC.

In operation S20, the control logic circuit 110 according to some example embodiments may control at least some capacitor cells included in the first capacitor cell array 121 based on the first partial code PC1.

For example, the control logic circuit 110 may control at least some capacitor cells of the first capacitor cell array 121 based on the first partial code PC1 generated by using the specified number of bits of the control code CC.

According to some example embodiments, the control logic circuit 110 may turn on capacitor cells, of which the number corresponds to the remainder obtained by dividing the control code CC by the first integer, from among the first capacitor cell array 121 based on the first partial code PC1.

For example, the first integer may be referenced as a ratio of capacitance changes as one capacitor cell is controlled in each of the first capacitor cell array 121 and the second capacitor cell array 122.

For example, the control logic circuit 110 may turn on the first capacitor cell C1, of which the number of "1" corresponds to a remainder of "1" obtained by dividing the control code CC of "5" by the first integer of "4", from among the first capacitor cell array 121.

In operation S30, the control logic circuit 110 according to some example embodiments may control at least some capacitor cells included in the second capacitor cell array 122 based on the second partial code PC2.

For example, the control logic circuit 110 may control at least some capacitor cells of the second capacitor cell array 122 based on the second partial code PC2 generated by using bits other than the specified number of bits among the control code CC.

According to some example embodiments, the control logic circuit 110 may turn on capacitor cells, of which the number corresponds to a quotient obtained by dividing the control code CC by the first integer, from among the second capacitor cell array 122 based on the second partial code PC2.

For example, the control logic circuit 110 may turn on the 1-1st capacitor cell C11, of which the number of "1" corresponds to the quotient of "1" obtained by dividing the control code CC of "5" by the first integer of "4", from among the second capacitor cell array 122.

In operation S40, the oscillator 120 according to some example embodiments may output the output signal OS with a specified, or alternatively desired frequency through an electrical path including turned-on capacitor cells.

For example, the PLL circuit 100 (or the oscillator 120) may output a second signal with a second frequency distinguished (e.g., different) from the first frequency of the first signal through the electrical path including the turned-on capacitor cells.

Referring to the above-mentioned example embodiments, it may be understood that an operation in which the control logic circuit 110 controls the oscillator 120 in FIG. 9 is substantially the same as an operation in which the control logic circuit 110 controls the first capacitor cell array 121 and the second capacitor cell array 122 in FIGS. 3A to 3C.

The control logic circuit 110 may control the first capacitor cell array 121 and the second capacitor cell array 122, which have different capacitance changes from each other, in response to the control code CC composed of a thermometer code.

In some example embodiments, the control logic circuit 110 may control the frequency of the output signal OS output through the oscillator 120 by controlling the first capacitor cell array 121 and the second capacitor cell array 122, which have different capacitance changes from each other.

For example, the first capacitor cell array 121 may be composed of the capacitor cells C1 to C5, which have the same capacitance change as unit capacitance corresponding to the control code CC.

In some example embodiments, the second capacitor cell array 122 may be composed of the capacitor cells C11 to C328, each of which has a capacitance change of an integer multiple (e.g., four times) of the unit capacitance corresponding to the control code CC.

For example, the control logic circuit 110 may control the capacitance of the oscillator 120 by the capacitance corresponding to the control code CC by using the first capacitor cell array 121 and the second capacitor cell array 122, which have different capacitance changes from each other.

According to the above-mentioned example embodiments, compared to the case of including the number of capacitor cells corresponding to the control code CC, the oscillator 120 according to some example embodiments of the present inventive concepts may be composed of the relatively small number of capacitor cells.

Accordingly, the PLL circuit 100 according to some example embodiments of the present inventive concepts may minimize the area of the oscillator 120.

Figure 10:
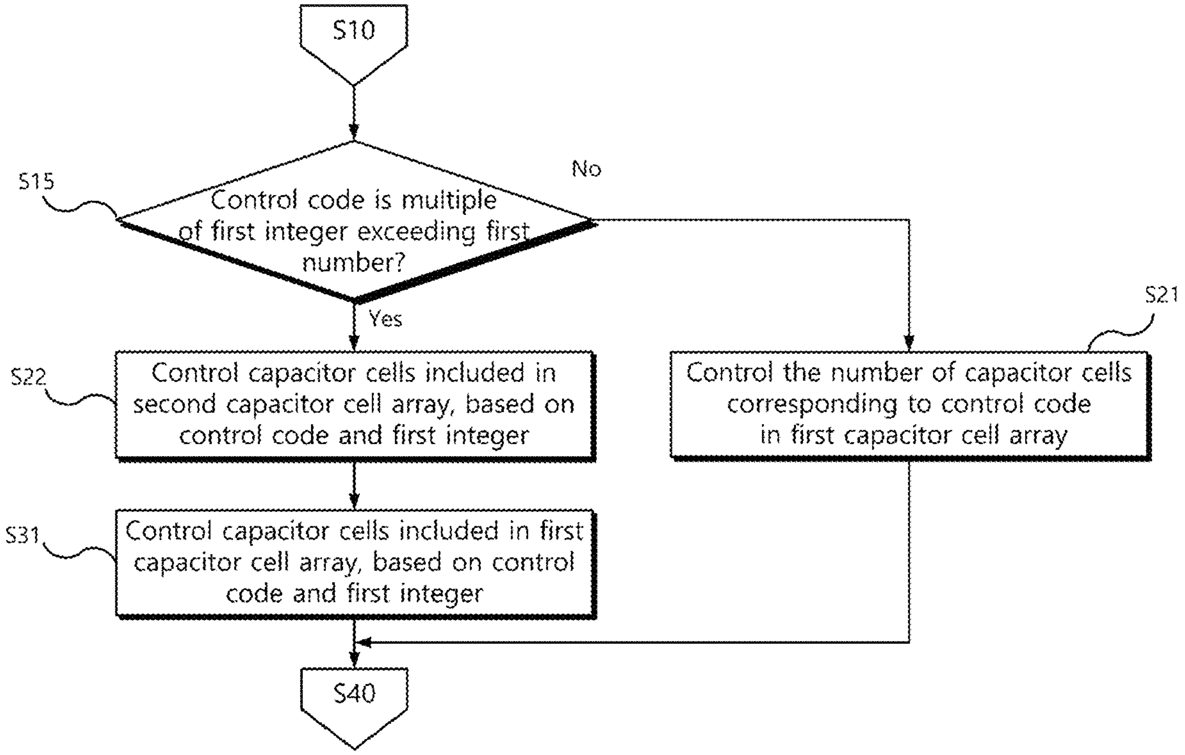
FIG. 10 is a flowchart showing a method of controlling a PLL circuit depending on a control code, according to some example embodiments.

FIG. 10 is a flowchart showing a method of controlling a PLL circuit depending on a control code, according to some example embodiments.

Referring to FIG. 10, the control logic circuit 110 according to some example embodiments may control the first capacitor cell array 121 and the second capacitor cell array 122 based on the number of capacitor cells constituting the first capacitor cell array 121 and the magnitude of the control code CC.

In operation S15, the control logic circuit 110 according to some example embodiments may determine whether the control code CC is a multiple of a first integer exceeding a first number.

For example, the first number may be referenced as the number of capacitor cells constituting the first capacitor cell array 121.

Hereinafter, for convenience of description, it is assumed that the first capacitor cell array 121 is composed of 5 capacitor cells, but example embodiments are not limited thereto.

Moreover, the control code CC according to some example embodiments may be composed of a thermometer code.

In some example embodiments, the first integer may be referenced as a ratio of capacitance changes between capacitor cells included in each of the first capacitor cell array 121 and the second capacitor cell array 122.

In some example embodiments, when the control code CC is less than or equal to the first number, in operation S21, the control logic circuit 110 may control the number of capacitor cells corresponding to the control code CC among the first capacitor cell array 121.

For example, when the control code CC is less than or equal to the first number, the control logic circuit 110 may control the number of capacitor cells corresponding to the control code CC among the first capacitor cell array 121 based on the first partial code PC1.

In some example embodiments, the control logic circuit 110 may turn on the first to fourth capacitor cells C1 to C4 in the first capacitor cell array 121 based on the control code CC of "4".

Moreover, for example, the control logic circuit 110 may turn on the first to fifth capacitor cells C1 to C5 of the first capacitor cell array 121 based on the control code CC of "5".

According to some example embodiments, when the control code CC is a multiple of the first integer exceeding the first number, in operation S22, the control logic circuit 110 may control capacitor cells included in the second capacitor cell array 122 based on the result of dividing the control code CC by the first integer.

For example, when the control code CC is a multiple of the first integer exceeding the first number, the control logic circuit 110 according to some example embodiments may control the same number of capacitor cells as a value, which is obtained by subtracting "1" from a quotient obtained by dividing the control code CC by the first integer, from among capacitor cells included in the second capacitor cell array 122.

For example, the control logic circuit 110 may control the 1-1st capacitor cell C11, of which the number of "1" is obtained by subtracting "1" from a quotient of "2" obtained by dividing the control code CC of "8" by the first integer of "4", from among the second capacitor cell array 122 based on the control code CC of "8".

In operation S31, the control logic circuit 110 may control capacitor cells included in the first capacitor cell array 121 based on the result of dividing the control code CC by the first integer.

For example, when the control code CC is a multiple of the first integer exceeding the first number, the control logic circuit 110 may control capacitor cells, of which the number is the first integer, from among the capacitor cells included in the first capacitor cell array 121.

For example, when the control code CC is a multiple of the first integer exceeding the first number, the control logic circuit 110 may control capacitor cells, of which the number is the first integer, from among the capacitor cells included in the first capacitor cell array 121 based on the first partial code PC1.

In some example embodiments, the control logic circuit 110 may turn on the first to fourth capacitor cells C1 to C4, of which the number of "4" corresponding to the first integer of "4", in the first capacitor cell array 121 based on the control code CC of "8".

It may be understood that an operation in which the control logic circuit 110 controls the oscillator 120 in FIG. 10 is substantially the same as an operation in which the control logic circuit 110 controls the first capacitor cell array 121 and the second capacitor cell array 122 in FIGS. 6A to 6D.

Referring to the above-mentioned example embodiments, the control logic circuit 110 may not control the second capacitor cell array 122, but may control the first capacitor cell array 121 in response to the control code CC (e.g., "4" or "5") that is greater than or equal to the first integer (e.g., "4") or less than or equal to the first number (e.g., "5").

According to some example embodiments, when the control code CC being a multiple of the first integer exceeds the first number, the control logic circuit 110 may control the same number of capacitor cells as a value, which is obtained by subtracting "1" from a quotient obtained by dividing the control code CC by the first integer, in the second capacitor cell array 122.

In some example embodiments, when the control code CC being a multiple of the first integer exceeds the first number, the control logic circuit 110 may control capacitor cells, of which the number corresponds to the first integer, from among the first capacitor cell array 121.

Accordingly, in some example embodiments, the control logic circuit 110 may reduce linearity deterioration due to mismatch or deviation of a capacitance change between the capacitor cells of the first capacitor cell array 121 and the capacitor cells of the second capacitor cell array 122.

Accordingly, the control logic circuit 110 may improve the linearity of a signal output through the PLL circuit 100.

Figure 11:
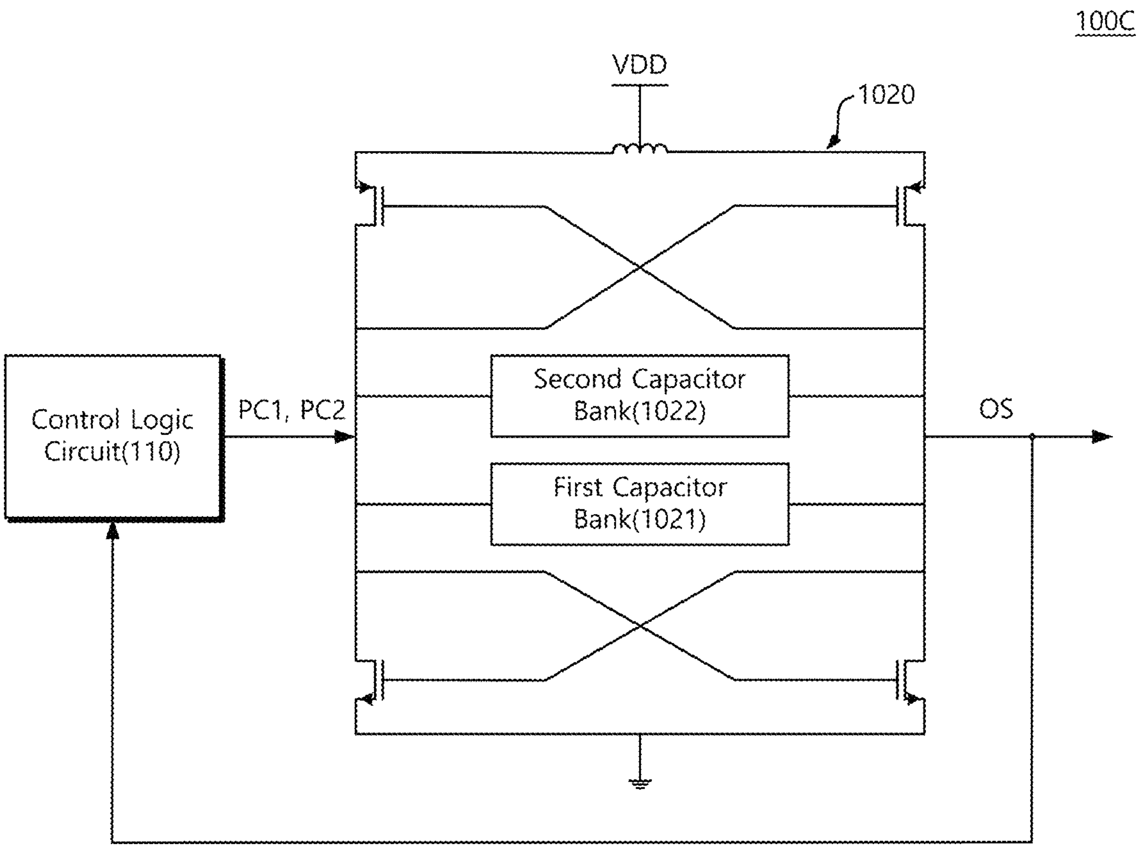
FIG. 11 shows a PLL circuit including a first capacitor bank and a second capacitor bank, according to some example embodiments.

FIG. 11 shows a PLL circuit including a first capacitor bank and a second capacitor bank, according to some example embodiments.

Referring to FIG. 11, a PLL circuit 100C according to some example embodiments may include the control logic circuit 110 and an oscillator 1020.

Here, it may be understood that the PLL circuit 100C shown in FIG. 11 is an example of the PLL circuit 100 shown in FIG. 1A. Accordingly, the same reference numerals are used for components the same or substantially the same as the above-described components, and descriptions the same as the above-described example embodiments are omitted to avoid redundancy.

According to some example embodiments, the oscillator 1020 may include a first capacitor bank 1021 and a second capacitor bank 1022. For example, the oscillator 1020 may include a first capacitor bank 1021 and a second capacitor bank 1022, which are connected in parallel with each other.

Here, it may be understood that the first capacitor bank 1021 includes the first capacitor cell array 121 and the second capacitor cell array 122 shown in FIG. 1A.

Accordingly, the first capacitor bank 1021 may include a plurality of capacitor cells arranged in the form of a matrix.

According to some example embodiments, the first capacitor bank 1021 may include the first capacitor cell array 121 and the second capacitor cell array 122, each of which is composed of different numbers of capacitor cells with different capacitance changes from each other.

For example, as one capacitor cell is controlled in each of the first capacitor cell array 121 and the second capacitor cell array 122, the capacitance of each of the first capacitor cell array 121 and the second capacitor cell array 122 may change by the different capacitances.

Accordingly, in some example embodiments the control logic circuit 110 may control the capacitance of the oscillator 120 to the magnitude corresponding to the control code CC by using the first capacitor cell array 121 and the second capacitor cell array 122, which have different capacitance changes from each other.

For example, the capacitor cells included in the first capacitor cell array 121 and the second capacitor cell array 122 may be formed to have the same area as each other.

For example, compared to the case of including the number of capacitor cells corresponding to the control code CC, the oscillator 120 according to some example embodiments of the present inventive concepts may be composed of the relatively small number of capacitor cells.

For example, the PLL circuit 100C according to some example embodiments of the present inventive concepts may minimize the area of the oscillator 120.

Furthermore, the second capacitor bank 1022 according to some example embodiments may include a plurality of capacitor cells arranged in the form of a matrix.

For example, each of the capacitor cells included in the second capacitor bank 1022 may include a capacitor with capacitance higher than each capacitor of the capacitor cells included in the first capacitor bank 1021.

According to some example embodiments, when the frequency of the output signal OS has a difference from the target frequency by a reference value or less, the control logic circuit 110 may control some of the capacitor cells among a plurality of capacitor cells included in the first capacitor bank 1021.

According to some example embodiments, when the frequency of the output signal OS has a difference from the target frequency, which exceeds the reference value, the control logic circuit 110 may control at least some of a plurality of capacitor cells included in the second capacitor bank 1022.

Compared to the case of controlling the frequency of the output signal OS by controlling the first capacitor bank 1021, the control logic circuit 110 according to some example embodiments may adjust the frequency to a great or relatively great extent when controlling the frequency of the output signal OS by controlling the second capacitor bank 1022.

Accordingly, the PLL circuit 100C according to some example embodiments of the present inventive concepts may reduce the time required for the oscillator 1020 to output a signal with the target frequency. Alternatively, in some example embodiments, the PLL circuit 100C may reduce the amount of time for outputting, by the oscillator, a signal with the target frequency.

As described above, the oscillator 120 of the PLL circuit 100 according to some example embodiments of the present inventive concepts includes the first capacitor cell array 121 and the second capacitor cell array 122, of which the capacitance changes by different magnitudes as one capacitor cell is controlled in each of the first capacitor cell array 121 and the second capacitor cell array 122.

According to some example embodiments, the control logic circuit 110 may control the capacitance of the oscillator 120 to the magnitude corresponding to the control code CC by using the first capacitor cell array 121 and the second capacitor cell array 122, which have different capacitance changes from each other.

In some example embodiments, the capacitor cells included in the first capacitor cell array 121 and the second capacitor cell array 122 may be formed to have the same area as each other.

For example, compared to the case of including the number of capacitor cells corresponding to the control code CC, the oscillator 120 according to some example embodiments of the present inventive concepts may be composed of the relatively small number of capacitor cells.

For example, the PLL circuit 100 according to some example embodiments of the present inventive concepts may minimize or reduce the area of the oscillator 120.

In some example embodiments, the PLL circuit 100 may output a signal having a specified, or alternatively desired frequency by using the oscillator 120 with a minimum or reduced area.

Moreover, according to some example embodiments of the present inventive concepts, the control logic circuit 110 may not control the second capacitor cell array 122, but may control the first capacitor cell array 121 in response to the control code CC (e.g., "4" or "5") that is greater than or equal to the first integer (e.g., "4") or less than or equal to the first number (e.g., "5").

For example, the first integer may be referenced as a ratio of capacitance changes between capacitor cells included in each of the first capacitor cell array 121 and the second capacitor cell array 122. In some example embodiments, the first number may be referenced as the number of capacitor cells constituting the first capacitor cell array 121.

For example, when the control code CC is greater than or equal to the first integer, the control logic circuit 110 may replace control of one capacitor cell of the second capacitor cell array 122 with control of capacitor cells of the first capacitor cell array 121, of which the number is the first integer.

Accordingly, in some example embodiments, the control logic circuit 110 may reduce linearity deterioration due to mismatch or deviation of a capacitance change between the capacitor cells of the first capacitor cell array 121 and the capacitor cells of the second capacitor cell array 122.

Accordingly, the control logic circuit 110 may improve the linearity of a signal output through the PLL circuit 100.

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., +10%) around the stated elements and/or properties thereof.

As described herein, any devices, electronic devices, modules, units, and/or portions thereof according to any of the example embodiments, may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, electronic devices, modules, units, and/or portions thereof according to any of the example embodiments.

Example embodiments in which a design is changed simply, or which are easily changed may be included in the present inventive concepts as well as example embodiments described above. In addition, technologies that are easily changed and implemented by using the above example embodiments may be included in the present inventive concepts. While the present inventive concepts have been described with reference to some example embodiments described above, it will be apparent to those of ordinary skill in the art that various changes and modifications may be made thereto without departing from the spirit and scope of the present inventive concepts as set forth in the following claims.

According to some example embodiments of the present inventive concepts, a PLL circuit may output a signal having a specified, or alternatively desired frequency by using an oscillator with a minimum or reduced area.

While the present inventive concepts have been described with reference to some example embodiments thereof, it will be apparent to those of ordinary skill in the art that various changes and modifications may be made thereto without departing from the spirit and scope of the present inventive concepts as set forth in the following claims.

What is claimed is:

1. A phase-locked loop (PLL) circuit, comprising:

an oscillator including a first capacitor cell array and a second capacitor cell array, each including a plurality of capacitor cells having different capacitances from each other; and a control logic circuit connected to the oscillator, the control logic circuit configured to generate a control code configured to control the oscillator such that the oscillator is configured to output a signal with a target frequency, the control code generated based on a first frequency of a first signal output from the oscillator and the target frequency, control at least one of the capacitor cells included in the first capacitor cell array based on a first partial code generated based on a specified number of bits of the control code, and control at least one of the capacitor cells included in the second capacitor cell array based on a second partial code generated based on bits other than the specified number of bits of the control code, wherein the oscillator is configured to output a second signal with a second frequency through an electrical path including capacitor cells configured to be turned on, from among the plurality of capacitor cells included in the oscillator, wherein the control code includes a thermometer code, wherein the control logic circuit is configured to control at least one of the plurality of capacitor cells to enable a capacitance of the oscillator to change based on a capacitance corresponding to the thermometer code, wherein the second capacitor cell array is configured to provide a capacitance change of a capacitor cell of the second capacitor cell array that is an integer multiple of a capacitance change of a capacitor cell of the first capacitor cell array, and wherein the control logic circuit is configured to, based on a division of the control code by a predetermined integer corresponding to the integer multiple, control the first capacitor cell array and the second capacitor cell array.

2. The PLL circuit of claim 1, wherein the control logic circuit is configured to, in response to controlling one capacitor cell of the first capacitor cell array, change a capacitance of the first capacitor cell array by a first capacitance, and in response to controlling one capacitor cell of the second capacitor cell array, change a capacitance of the second capacitor cell array by a second capacitance, a value of the second capacitance obtained based on multiplying a first integer by the first capacitance.

3. The PLL circuit of claim 2, wherein the control logic circuit is configured to:

control a same number of capacitor cells as a quotient, the quotient obtained based on dividing the control code by the first integer, from among the capacitor cells included in the second capacitor cell array, based on the second partial code; and control a same number of capacitor cells as a remainder, the remainder obtained based on dividing the control code by the first integer, from among the capacitor cells included in the first capacitor cell array, based on the first partial code.

4. The PLL circuit of claim 2, wherein the first capacitor cell array includes a first number of capacitor cells, and when the control code is less than or equal to the first number, the control logic circuit is configured to control a number of capacitor cells, the number corresponding to the control code, from among the first capacitor cell array based on the first partial code.

5. The PLL circuit of claim 4, wherein the control logic circuit is configured to:

when the control code is a multiple of the first integer exceeding the first number, control a number of capacitor cells, the number obtained by subtracting 1 from a quotient obtained by dividing the control code by the first integer, from among the capacitor cells included in the second capacitor cell array; and control a number of capacitor cells, the number corresponding to the first integer, from among the capacitor cells included in the first capacitor cell array.

6. The PLL circuit of claim 1, wherein the control logic circuit includes:

a comparator configured to generate the control code by comparing the first frequency with the target frequency;

a dithering circuit configured to generate a dithering signal by dithering the control code;

a first decoder configured to generate the first partial code by decoding the specified number of bits of the dithering signal; and a second decoder configured to generate the second partial code by decoding bits other than the specified number of bits of the dithering signal.

7. The PLL circuit of claim 1, further comprising:

a plurality of row control lines and a plurality of column control lines connected to the capacitor cells included in the second capacitor cell array;

a row decoder configured to select at least one of the plurality of row control lines by decoding a row component of the second partial code; and a column decoder configured to select at least one of the plurality of column control lines by decoding a column component of the second partial code.

8. The PLL circuit of claim 1, wherein each of the capacitor cells included in the first capacitor cell array and each of the capacitor cells included in the second capacitor cell array have a same area.

9. The PLL circuit of claim 1, wherein each of a plurality of capacitor cells included in the oscillator includes at least two or more capacitors connected in series with each other and a transistor connected between the capacitors, and the control logic circuit is configured to turn on the transistor of the capacitor cell selected based on the control code, from among the plurality of capacitor cells.

10. A control method of a phase-locked loop (PLL) circuit, the method comprising:

generating a control code for controlling at least some of a plurality of capacitor cells included in an oscillator based on a first frequency of a first signal output from the oscillator and a target frequency;

controlling at least one capacitor cells of a first capacitor cell array included in the oscillator based on a first partial code generated based on a specified number of bits of the control code;

controlling at least one capacitor cells of a second capacitor cell array included in the oscillator based on a second partial code generated based on bits other than the specified number of bits of the control code; and outputting, by the oscillator, a second signal with a second frequency through an electrical path including capacitor cells, which are turned on, from among the plurality of capacitor cells, wherein the first capacitor cell array and the second capacitor cell array include different numbers of capacitor cells with different capacitances from each other, wherein the control code includes a thermometer code, wherein the second capacitor cell array is configured to provide a capacitance change of a capacitor cell of the second capacitor cell array that is an integer multiple of a capacitance change of a capacitor cell of the first capacitor cell array, and wherein the method comprises:

controlling at least one of the plurality of capacitor cells such that a capacitance of the oscillator changes based on a capacitance corresponding to the thermometer code, and controlling, based on a division of the control code by a predetermined integer corresponding to the integer multiple, the first capacitor cell array and the second capacitor cell array.

11. The method of claim 10, wherein, in response to controlling one capacitor cell of the first capacitor cell array, changing a capacitance of the first capacitor cell array by a first capacitance, and in response to controlling one capacitor cell of the second capacitor cell array, changing a capacitance of the second capacitor cell array by a second capacitance, a value of the second capacitance obtained by multiplying a first integer by the first capacitance.

12. The method of claim 11, further comprising:

controlling a same number of capacitor cells as a quotient, the quotient obtained by dividing the control code by the first integer, from among capacitor cells included in the second capacitor cell array, based on the second partial code; and controlling a same number of capacitor cells as a remainder, the remainder obtained by dividing the control code by the first integer, from among capacitor cells included in the first capacitor cell array, based on the first partial code.

13. The method of claim 12, wherein the first capacitor cell array includes a first number of capacitor cells, and the controlling of the at least one capacitor cell of the first capacitor cell array based on the first partial code includes:

when the control code is less than or equal to the first number, controlling a number of capacitor cells, the number corresponding to the control code, from among the first capacitor cell array based on the first partial code.

14. The method of claim 13, further comprising:

when the control code is a multiple of the first integer exceeding the first number:

controlling a number of capacitor cells, the number obtained by subtracting 1 from a quotient obtained by dividing the control code by the first integer, from among the capacitor cells included in the second capacitor cell array; and controlling a number of capacitor cells, the number corresponding to the first integer, from among the capacitor cells included in the first capacitor cell array.

15. A phase-locked loop (PLL) circuit, comprising:

an oscillator including a first capacitor cell array and a second capacitor cell array, each including a plurality of capacitor cells having different capacitances from each other; and a control logic circuit configured to generate a control code based on a first frequency of a first signal output from the oscillator and a target frequency, the control code including thermometer code, the control code configured to control capacitor cells included in the oscillator, the control logic circuit configured to, when a noise of the first signal is less than a threshold value, turn on a same number of capacitor cells as a quotient, the quotient obtained by dividing the control code by a first integer, from among capacitor cells included in the second capacitor cell array, and turn on a same number of capacitor cells as a remainder, is the remainder obtained by dividing the control code by the first integer, from among capacitor cells included in the first capacitor cell array, and the oscillator configured to output a second signal with a second frequency through an electrical path including capacitor cells configured to be turned on, from among the plurality of capacitor cells.

16. The PLL circuit of claim 15, wherein the control logic circuit is configured to, in response to turning on one capacitor cell of the first capacitor cell array, increase a capacitance of the first capacitor cell array by a first capacitance, and in response to turning on one capacitor cell of the second capacitor cell array, increase a capacitance of the second capacitor cell array by a second capacitance, a value of the second capacitance obtained by multiplying the first integer by the first capacitance.

17. The PLL circuit of claim 15, wherein the first capacitor cell array includes a first number of capacitor cells, and when the noise of the first signal is greater than or equal to the threshold value, the control logic circuit is configured to turn on a number of capacitor cells, the number corresponding to the control code, from among the first capacitor cell array in response to the control code being less than or equal to the first number.

18. The PLL circuit of claim 17, wherein the control logic circuit is configured to, when the noise of the first signal is greater than or equal to the threshold value, in response to the control code being a multiple of the first integer exceeding the first number, turn on a number of capacitor cells, the number obtained by subtracting 1 from a quotient obtained by dividing the control code by the first integer, from among the capacitor cells included in the second capacitor cell array, and turn on a number of capacitor cells, the number corresponding to the first integer, from among the capacitor cells included in the first capacitor cell array.

* * * * *